(12) United States Patent
Owada

(10) Patent No.: US 9,183,914 B2
(45) Date of Patent: Nov. 10, 2015

(54) SEMICONDUCTOR MEMORY DEVICE

(71) Applicant: Renesas Electronics Corporation, Kawasaki-shi, Kanagawa (JP)

(72) Inventor: Fukuo Owada, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/682,578

(22) Filed: Nov. 20, 2012

(65) Prior Publication Data

US 2013/0135921 A1    May 30, 2013

(30) Foreign Application Priority Data

Nov. 25, 2011    (JP) ................................. 2011-257063

(51) Int. Cl.
*G11C 11/00*    (2006.01)
*G11C 5/14*    (2006.01)
(Continued)

(52) U.S. Cl.
CPC .............. *G11C 11/21* (2013.01); *G11C 14/009* (2013.01)

(58) Field of Classification Search
CPC .. G11C 11/56; G11C 13/0009; G11C 17/165; G11C 17/16; G11C 11/21; G11C 7/10; G11C 8/12; G11C 11/005; G11C 11/413; G11C 11/4076; G11C 11/4097; G11C 2207/002; G11C 2207/2227; G11C 2207/2245; G11C 7/1018; G11C 7/1045; G11C 7/22; G11C 8/00; G11C 11/4096; G11C 7/1006; G11C 7/1078; G11C 11/00
USPC ........................................................ 365/148
See application file for complete search history.

(56) References Cited

U.S. PATENT DOCUMENTS 5,535,154 A    7/1996    Kiyono
6,331,947 B1    12/2001    Widdershoven et al.
6,930,344 B2    8/2005    Yokozeki et al.
(Continued)

FOREIGN PATENT DOCUMENTS

JP    6-076582 A    3/1994
JP    7-183401 A    7/1995
(Continued)

OTHER PUBLICATIONS

Logic-based Mega-bit CuxSiyO emRRAM with Excellent Scalability Down to 22nm Node for post-emFLASH SOC Era by Yanliang Wang, et al.*
(Continued)

*Primary Examiner* — Hien Nguyen
(74) *Attorney, Agent, or Firm* — McGinn IP Law Group, PLLC

(57) ABSTRACT

A first ReRAM unit having a resistance change layer is provided between a first access transistor configuring the SRAM and a first bit line, and a second ReRAM unit having a resistance change layer is provided between a second access transistor and a second bit line. When a low potential (L=0V) is held at a first storage node and a high potential (H=1.5V) is held at a second storage node at the end of a normal operation period of the SRAM, the first ReRAM unit is set to ON state (ON), and the second ReRAM unit is set to OFF state (OFF); accordingly, the retained data of the SRAM is written in to the ReRAM units. When the SRAM returns to the normal operation again, data corresponding to the storage nodes are written back and the ReRAM units are both set to ON state (reset).

19 Claims, 26 Drawing Sheets

(51) Int. Cl.
  *G11C 11/21*  (2006.01)
  *G11C 14/00*  (2006.01)

(56) References Cited

U.S. PATENT DOCUMENTS

| | | | |
|---|---|---|---|
| 7,663,917 B2 | 2/2010 | Cuppens et al. | |
| 8,900,421 B2 | 12/2014 | Jou et al. | |
| 2008/0225590 A1* | 9/2008 | Lamorey | 365/185.05 |
| 2011/0280073 A1* | 11/2011 | Chiu et al. | 365/185.08 |
| 2012/0020159 A1* | 1/2012 | Ong | 365/185.08 |

FOREIGN PATENT DOCUMENTS

| | | |
|---|---|---|
| JP | 7-226088 A | 8/1995 |
| JP | 2003-511809 A | 3/2003 |
| JP | 2004-207282 A | 7/2004 |
| JP | 2006-527897 A | 12/2006 |
| JP | 2007-157183 A | 6/2007 |
| JP | 2008-294103 A | 12/2008 |
| JP | 2011-124528 A | 6/2011 |

OTHER PUBLICATIONS

Wei Wang et al; "Nonvolatile SRAM Cell", 1-4244-0439-8/06/$20.00(c) 2006 IEEE.

Michael Fliesler et al; "A 15ns 4Mb NVSRAM in 0.13u SONOS Technology", 987-1-4244-1 547-2/08/$25.00(c) 2008 IEEE pp. 83-86.

Japanese Office Action dated Mar. 24, 2015 with an English translation.

* cited by examiner

SEMICONDUCTOR MEMORY DEVICE

CROSS-REFERENCE TO RELATED APPLICATIONS

The disclosure of Japanese Patent Application No. 2011-257063 filed on Nov. 25, 2011 including the specification, drawings, and abstract is incorporated herein by reference in its entirety.

BACKGROUND

The present invention relates to a semiconductor memory device, in particular, to technology which is effective when applied to a semiconductor memory device which includes an SRAM.

An SRAM (Static Random Access Memory) is a kind of a semiconductor memory, and stores data by use of a flip-flop. For example, in an SRAM, data ("1" or "0") is stored in two cross-coupled CMOS inverters configured with four transistors. Since two transistors are needed additionally for a read and write access, a memory cell of a typical SRAM is configured with six transistors.

For example, Patent Literature 1 (Published Japanese Translation of PCT International Publication No. 2006-527897) cited below discloses a nonvolatile static memory cell in which a nonvolatile cells (14, 16) are cross-coupled to internal nodes (A, B) of the static memory cell. One nonvolatile cell (14) of the two nonvolatile cells has a control gate coupled to B and a source coupled to A, and the other nonvolatile cell (16) has a control gate coupled to A and a source coupled to B.

Patent Literature 2 (Published Japanese Unexamined Patent Application No. Hei 7 (1995)-226088) cited below discloses a semiconductor memory device which can realize a nonvolatile property while maintaining speediness of a static memory (SRAM). This semiconductor memory device has an SRAM memory cell unit 1 and a nonvolatile memory cell unit 3. The SRAM memory cell unit 1 is configured by coupling a first and a second selection transistor T7 and T8 to two transistors T1 and T2, of which the respective sources are grounded and the respective drains are coupled to each other's gates. The nonvolatile memory cell unit 3 is configured with nonvolatile transistors T3 and T4 which are provided with two gates, a floating gate and a control gate, and the drains coupled to a power supply line, thereby storing the state of the SRAM memory cell unit 1.

Patent Literature 3 (Published Japanese Translation of PCT International Publication No. 2003-511809) discloses a nonvolatile MOSRAM cell configured with a first and a second inverter and capacitors (G1, G2) each coupled in series to a control electrode of each of the first and the second inverter.

Patent Literature 4 (Published Japanese Unexamined Patent Application No. 2007-157183) cited below discloses a nonvolatile memory configured with a flip-flop which comprises a pair of series circuits of a load transistor and a memory transistor, coupled in a static latch mode. This nonvolatile memory is provided with leakage-current cutoff elements (T16, T26) coupled to a current path through which a leakage current flows into the power supply side of the flip-flop via the load transistor in writing and erasing.

Patent Literature 5 (Published Japanese Unexamined Patent Application No. Hei 6 (1994)-76582) cited below discloses a nonvolatile memory which stores information by changing a threshold voltage of field effect transistors (RMmn ($o_+$), RMmn (o−)) which act as a pair of flip-flops of a memory cell.

Patent Literature 6 (Published Japanese Unexamined Patent Application No. Hei 7 (1995)-183401) cited below discloses a nonvolatile memory cell which comprises four N-channel MOS transistors and two P-channel TFTs as load elements. The TFT has a laminated structure comprised of a first TFT gate electrode 9 in a lower layer, a TFT gate insulating film 10, a body layer (semiconductor layer) 13 which forms a channel of the TFT, a second gate insulating film 22 which has ferroelectricity, and a second TFT gate electrode 23.

Patent Literature 7 (Published Japanese Unexamined Patent Application No. 2004-207282) cited below discloses a nonvolatile SRAM cell which comprises a pair of two cross-coupled CMOS inverters c1 and c2 and ferroelectric capacitors fc1 and fc2. The ferroelectric capacitors fc1 and fc2 are formed respectively by lower electrodes BEL1 and BEL2, ferroelectric films FER1 and FER2, and upper electrodes TEL1 and TEL2, the lower electrodes BEL1 and BEL2 being respectively coupled to a drain diffusion area included in corresponding one of the two CMOS inverters.

Non Patent Literature 1 cited below discloses a nonvolatile SRAM cell which has NVM devices (XR1, XR2) coupled between two storage nodes of the SRAM and a control line (ctrl).

Non Patent Literature 2 cited below discloses a nonvolatile SRAM which has two SONOS transistors as a memory device. The SONOS transistors are coupled respectively between two storage nodes of the SRAM and a VCCT line.

(Patent Literature 1) Published Japanese Translation of PCT International Publication No. 2006-527897

(Patent Literature 2) Published Japanese Unexamined Patent Application No. Hei 7 (1995)-226088

(Patent Literature 3) Published Japanese Translation of PCT International Publication No. 2003-511809

(Patent Literature 4) Published Japanese Unexamined Patent Application No. 2007-157183

(Patent Literature 5) Published Japanese Unexamined Patent Application No. Hei 6 (1994)-76582

(Patent Literature 6) Published Japanese Unexamined Patent Application No. Hei 7 (1995)-183401

(Patent Literature 7) Published Japanese Unexamined Patent Application No. 2004-207282

(Non Patent Literature 1) Wei Wang et al; "Nonvolatile SRAM Cell", 1-4244-0439-8/06/$20.00(c) 2006 IEEE (Non Patent Literature 2) Michael Fliesler et al; "A 15ns 4 Mb NVSRAM in 0.13u SONOS Technology", 987-1-4244-1 547-2/08/$25.00 (c) 2008 IEEE PP. 83-86

SUMMARY

Since the SRAM described above is volatile, when the supplied power source is cut off, the contents stored in the SRAM will be lost. In the normal operation state of the SRAM, the power supply potential is always applied to a CMOS inverter which configures the SRAM; therefore, the consumption current is large.

Accordingly, it is desired to realize a memory device which can hold the stored data even when the supplied power source of an SRAM memory cell is cut off.

The above and other subjects and new features of the present invention will become clear from the description and the accompanying drawings of the present specification.

A semiconductor memory device according to a typical embodiment of the invention disclosed in the present application comprises (a1) a first transistor coupled between a power node and a first node and (a2) a second transistor coupled between the first node and a low potential node, (a3)

a third transistor coupled between the power node and a second node and (a4) a fourth transistor coupled between the second node and the low potential node, and (a5) a fifth transistor with one end coupled to the first node and (a6) a sixth transistor with one end coupled to the second node. The semiconductor memory device further comprises (b1) a first resistance change layer coupled between the other end of the fifth transistor and a first bit line, and (b2) a second resistance change layer coupled between the other end of the sixth transistor and a second bit line.

A semiconductor memory device according to a typical embodiment of the invention disclosed in the present application comprises (a1) a first transistor coupled between a power node and a first node and (a2) a second transistor coupled between the first node and a low potential node, (a3) a third transistor coupled between the power node and a second node and (a4) a fourth transistor coupled between the second node and the low potential node, and (a5) a fifth transistor with one end coupled to the first node and (a6) a sixth transistor with one end coupled to the second node. The semiconductor memory device further comprises (b1) a first resistance change layer coupled between the other end of the fifth transistor and a first bit line, and (b2) a second resistance change layer coupled between the other end of the sixth transistor and a second bit line. The first resistance change layer is arranged over a first connection section over a source-drain area of the fifth transistor, and the first bit line is arranged over the first resistance change layer.

According to the semiconductor memory device according to the typical embodiment described in the following, it is possible to improve the property of the semiconductor memory device.

DETAILED DESCRIPTION

Figure 1:
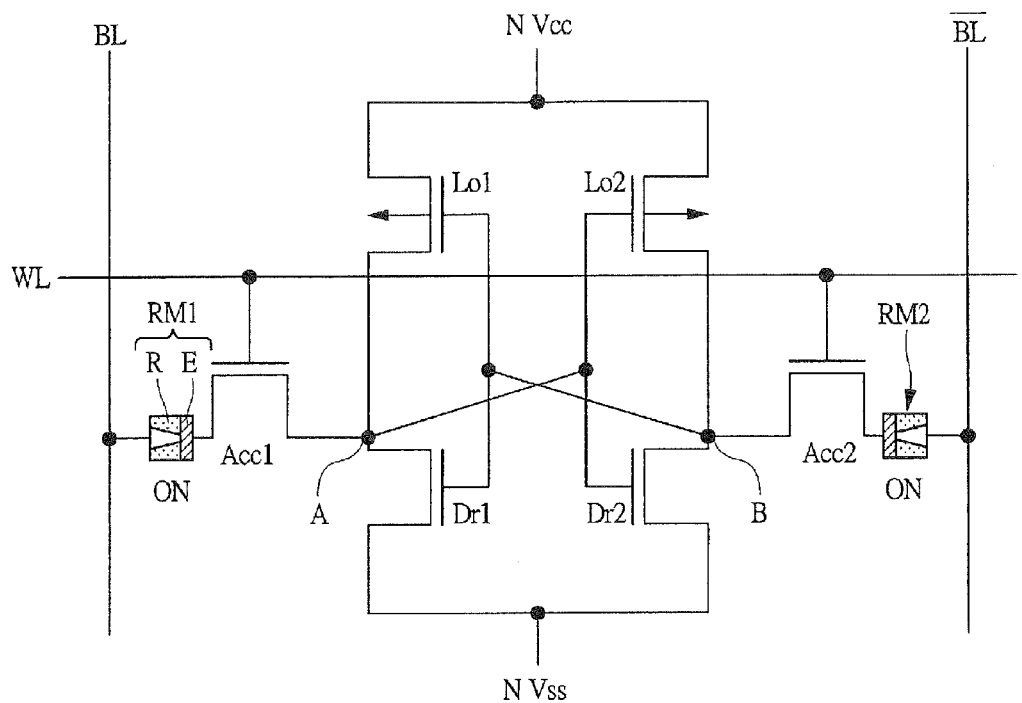
FIG. 1 is an equivalent circuit diagram illustrating a memory cell configuration of a semiconductor memory device according to the present embodiment.

In the following embodiment, when there is the necessity for convenience, the explanation will be divided into plural sections or plural embodiments. However, unless otherwise specified, they are not irrelevant with each other but they have a relationship that one is a modified example, an application, detailed explanation, and supplementary explanation of a part or all of the other. In the following embodiment, when the number of elements, etc. (including the number, a numeric value, quantity, a range, etc.) is referred to, the number of elements may be not restricted to a specific number but may be more than or less than the specific number, except for the case where it is specified in particular or clearly restricted to the specific number in principle.

In the following embodiment, a component (including an element step etc.) referred to is not always essential, except for the case where it is specified in particular or clearly considered to be essential in principle. Similarly, in the following embodiment, when referring to the shape, positional relationship, etc. of a component etc, what is analogous or similar substantially to the shape, positional relationship etc. shall be included, except for the case where it is specified in particular or clearly not considered to be so in principle. The same applies to the number of elements (including the number, a numeric value, quantity, a range, etc.) described above.

Hereinafter, embodiments of the present invention will be explained in detail with reference to the accompanying drawings. In the entire diagrams for explaining the embodiments of the present invention, the same or a related symbol is attached to the member which has the same function, and the repeated explanation thereof is omitted. When plural similar members (regions) exist, an individual or specific region may be indicated by adding a mark to the symbol of a generic name. In the following embodiments, except when necessary in particular, the repeated explanation of the same or a similar part is omitted in principle.

In a drawing employed in the embodiments, even if it is a sectional view, hatching may be omitted in order to make the drawing easier to see. Even if the drawing is a plan view, hatching may be attached on the contrary in order to make the drawing easier to see.

In a sectional view and a plan view, the size of each region does not correctly correspond to an actual device, and a specific region may be displayed relatively larger in order to make the drawing easier to see. Even when a plan view and a sectional view correspond to each other, each region may be displayed in a different size.

Embodiment

<<Circuit Configuration>>

FIG. 1 is an equivalent circuit diagram illustrating a memory cell configuration of a semiconductor memory device (also called a semiconductor device, a semiconductor integrated circuit device) according to the present embodiment.

As illustrated in the figure, the semiconductor memory device according to the present embodiment is an SRAM which stores data in a flip-flop unit (also called an FF unit, or a latch circuit). The flip-flop unit comprises two cross-coupled CMOS inverters configured with four transistors. Data ("1" or "0") is stored in the input/output part of the CMOS inverter. "CMOS" is the abbreviation for "Complementary Metal Oxide Semiconductor."

In the present embodiment, ReRAM units (nonvolatile memory units) RM1 and RM2 are provided in the input/output part of the CMOS inverter via an access transistor. "ReRAM" is the abbreviation for "Resistance Random Access Memory", and means a memory which utilizes change of electric resistance by application of voltage. It is also called a "resistance change memory." In this way, the semiconductor memory device according to the present embodiment has a configuration of an SRAM, and a ReRAM unit (nonvolatile memory unit). Therefore, the present semiconductor memory device can also be said to be "a nonvolatile SRAM" or "an SRAM with a built-in nonvolatile memory unit."

The following explains a memory cell configuration in detail, with reference to FIG. 1.

As illustrated in the figure, a memory cell is arranged at the cross point of a pair of bit lines (a bit line BL and a bit line/BL ("BL" with a over bar in the following drawings) and a word line WL. This memory cell comprises a pair of load transistors (also called a load MOS, a transistor as a load, an MIS-FET as a load) Lo1 and Lo2, a pair of access transistors (also called an access MOS, a transistor for access, an access MISFET, a transistor for transfer) Acc1 and Acc2 and a pair of driver transistors (also called driver MOS's, a transistor for drive, an MISFET for drive) Dr1 and Dr2.

Of the six transistors which configure the memory cell, the load transistors (Lo1, Lo2) are p-type (p-channel type) transistors, and the access transistors (Acc1, Acc2) and the driver transistors (Dr1, Dr2) are n-type (n-channel type) transistors.

"MISFET" is the abbreviation for "Metal Insulator Semiconductor Field Effect Transistor", and may be called MOS. Hereinafter, the load transistor, the access transistor, and the driver transistor may be simply called a "transistor." Each transistor may be designated only by the symbol of each transistor (Lo1, Lo2, Acc1, Acc2, Dr1, Dr2).

Of the six transistors which configure the memory cell, Lo1 and Acc1 configure one CMOS inverter, and Lo2 and Acc2 configure the other CMOS inverter. The input/output parts (storage nodes A, B) of these pairs of CMOS inverters are cross-coupled mutually, and configure a flip-flop unit (FF unit) as an information storage unit which stores 1-bit information.

The following explains in full detail the coupling relation of the six transistors which configure the SRAM memory cell.

Lo1 is coupled between a power supply potential node (power node) NVcc and a storage node (a first node) A, Dr1 is coupled between the storage node A and a reference potential node (low potential node) NVss, and the gate electrodes of Lo1 and Dr1 are coupled to a storage node (a second node) B. To the power supply potential node NVcc, a first power supply potential Vcc is applied in a normal operation period of the SRAM to be described later, and a second power supply potential Vcc2 and a third power supply potential Vcc3 are applied before and after a standby period to be described later. A potential lower than the first, the second, and the third power supply potential (Vcc, Vcc2, Vcc3), that is a reference potential (also called 0V, a ground potential, ground) in the present case is applied to a reference potential node NVss. The first power supply potential Vcc is 1.5V, for example. The second power supply potential Vcc2 is a potential higher than the first power supply potential Vcc, for example, 2.0V. The third power supply potential Vcc3 is a potential higher than the second power supply potential Vcc2, for example, 3.5V.

Lo2 is coupled between the power supply potential node NVcc and the storage node B, Dr2 is coupled between the storage node B and the reference potential node NVss, and the gate electrodes of Lo2 and Dr2 are coupled to the storage node A.

Acc1 is coupled to the storage node A, Acc2 is coupled to the storage node B, and the gate electrodes of Acc1 and Acc2 are coupled to a word line WL (they act as the word line). The drive potential of the word line WL is, for example, the first power supply potential Vcc (for example, 1.5V).

Here, the ReRAM units RM1 and RM2 are provided in the SRAM memory cell according to the present embodiment. The ReRAM unit (RM1, RM2) has a resistance change layer (also called a memory layer, a memory unit, a state change layer, a resistance change layer, a variable resistance layer, a phase change layer, magnetic change layer) R. The resistance change layer R has a first end and a second end, and an electrode part E is provided in the first end. The first end (on the side of the electrode part E) of the ReRAM unit RM1 is coupled to Acc1 (the end on the opposite side of the storage node A), and the second end is coupled to the bit line BL. The first end (on the side of the electrode part E) of the ReRAM unit RM2 is coupled to Acc2 (the end on the opposite side of the storage node B), and the second end is coupled to the bit line /BL.

<<Circuit Operation>>

Next, the operation of the ReRAM unit and the SRAM is explained.

<Operation of the ReRAM Unit> FIG. 2 is a circuit diagram illustrating the operation of the ReRAM unit. The resistance change layer R changes its resistance, when a potential difference greater than the predetermined potential (also called a specific potential, a first potential) is produced between the first end and the second end.

Figure 2A:
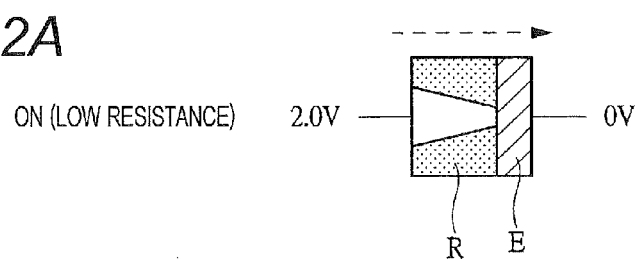
FIG. 2A and FIG. 2B are circuit diagrams illustrating operation of a ReRAM unit.

Specifically, as illustrated in FIG. 2A, when the second power supply potential Vcc2 (2.0V) is applied to the second end of the resistance change layer R, and a potential lower than the second power supply potential Vcc2 by the predetermined potential (here the reference potential 0V) is applied to the first end (on the side of the electrode part E) of the resistance change layer R, the resistance change layer R changes to a low resistance state. The predetermined potential is 2.0V, for example. As illustrated in FIG. 2A, the case where the potential difference greater than the predetermined potential is produced between the first end and the second end and where the potential applied to the second end is higher is called "positive bias." In this way, when the positive bias is applied to the resistance change layer R, the resistance change layer R changes to the low resistance state and turns into ON state (ON). That is, current flows through the resistance change layer R.

Figure 2B:
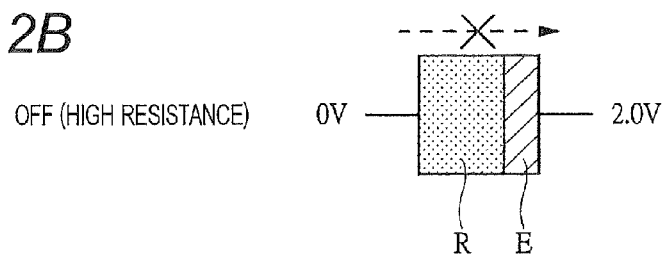

On the other hand, as illustrated in FIG. 2B, when the second power supply potential Vcc2 (2.0V) is applied to the first end (on the side of the electrode part E) of the resistance change layer R, a potential lower than the second power supply potential Vcc2 by the predetermined potential (here the reference potential 0V) is applied to the second end of the resistance change layer R, the resistance change layer R changes to a high resistance state. The predetermined potential is 2.0V, for example. As illustrated in FIG. 2B, the case where the potential difference greater than the predetermined potential is produced between the first end and the second end and where the potential applied to the first end is higher is called "reverse bias." In this way, when the reverse bias is applied to the resistance change layer R, the resistance change layer R changes to the high resistance state and turns into OFF state (OFF). That is, current hardly flows through the resistance change layer R.

When the potential difference between the first end and the second end of the resistance change layer R is less than the predetermined potential, no change of resistance is produced and the state until that moment (ON state or OFF state) is maintained.

Figure 3:
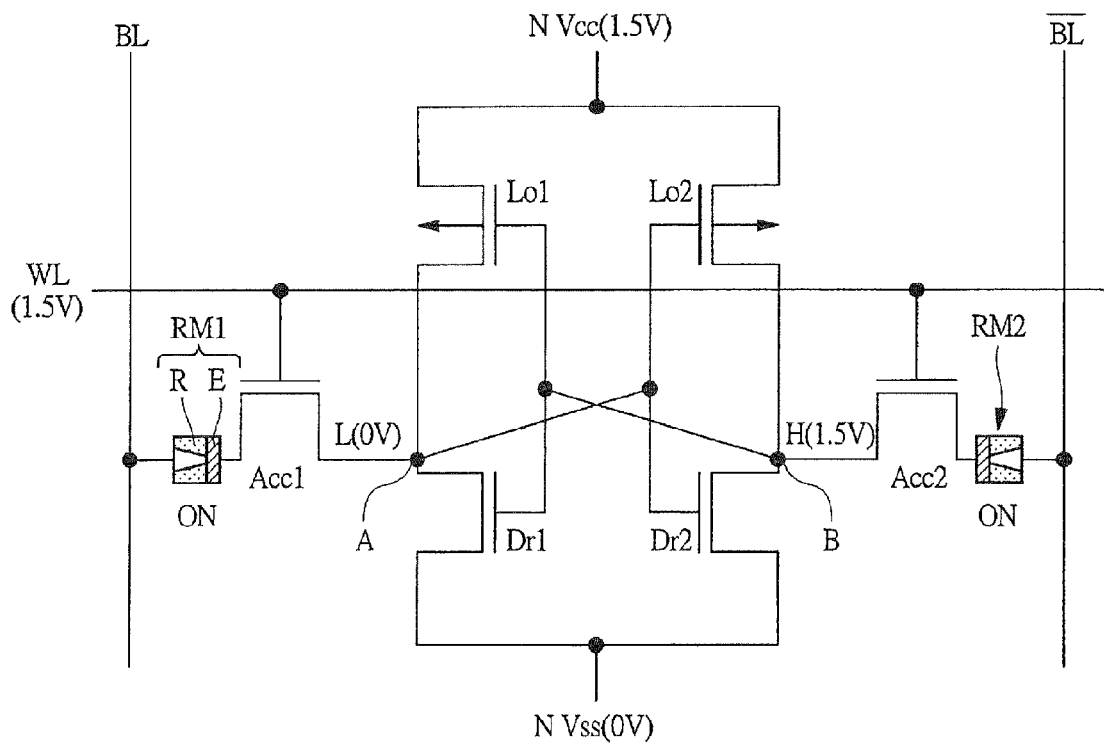
FIG. 3 is a circuit diagram illustrating an SRAM operation.

<Operation of the SRAM> (Normal operation of the SRAM) Next, the normal operation of the SRAM is explained. FIG. 3 is a circuit diagram illustrating an SRAM operation.

In the normal operation period (the first period) of the SRAM, both of the ReRAM units RM1 and RM2 are kept in ON state (ON) so that the ReRAM units RM1 and RM2 may not impede the operation of the SRAM.

That is, when the storage node B of the CMOS inverter is a high potential (H level, the second level, H=1.5V), Dr1 is in ON state; accordingly, the storage node A of the other CMOS inverter becomes a low potential (L level, the first level, L=0V). Therefore, Lo2 becomes in ON state and the high potential (H=1.5V) of the storage node B is held. That is, the state of the storage nodes A and B is held mutually by the flip-flop unit configured with a pair of cross-coupled CMOS inverters, and the data (information) is stored (retained).

On the other hand, the word line WL is coupled to each of the gate electrodes of Acc1 and Acc2. That is, when the word line WL is a high potential (H=1.5V), Acc1 and Acc2 are in ON state and the flip-flop circuit and the bit lines (BL and /BL) are electrically coupled. Accordingly, the potential state of the storage nodes A and B (a combination of H and L, or a combination of L and H) appears in the bit lines BL and /BL, and is read as data of the memory cell.

When writing information to the memory cell, the word line WL is set to a high potential (H=1.5V), and Acc1 and Acc2 are controlled into ON state; accordingly, the flip-flop circuit and the bit lines (BL and /BL) are electrically coupled, and the information of the bit lines BL and /BL (a combination of H and L, or a combination of L and H) is transferred (written) to the storage nodes A and B, thereby data is stored as described above.

(Standby operation) Next, a flow from the standby period (the second period) after the normal operation period of the SRAM up to another normal operation period (the third period) of the SRAM is explained.

Figure 4:
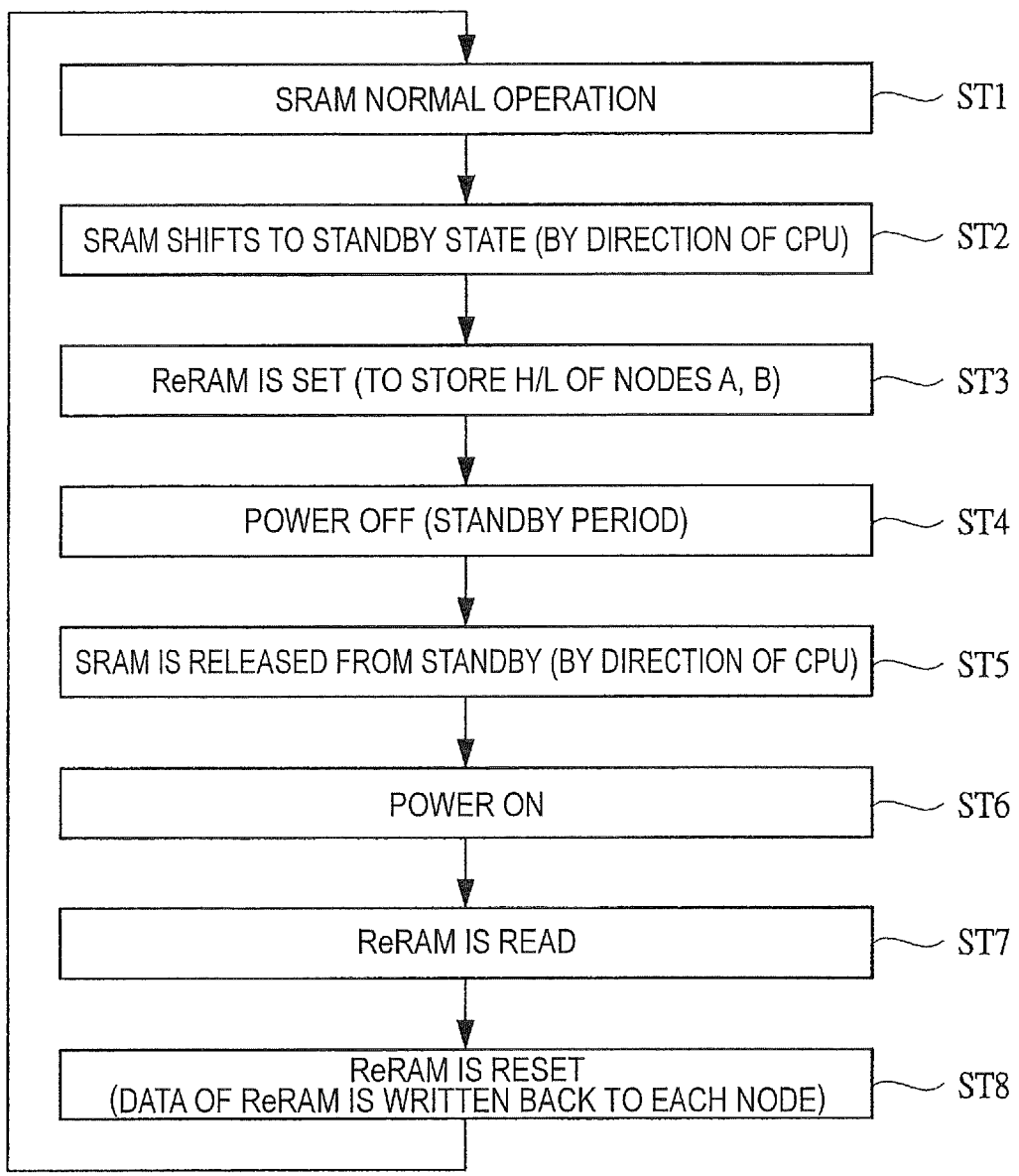
FIG. 4 is a flow chart illustrating operation of the semiconductor memory device according to the present embodiment.

FIG. 4 is a flow chart illustrating operation of the semiconductor memory device according to the present embodiment. In the normal operation period ST1 of the SRAM described above, the normal operation, data storage, read, write, etc. of the SRAM are performed. In this case, as described above, both of the ReRAM units RM1 and RM2 are in ON state, and the ReRAM units RM1 and RM2 do not impede the operation of the SRAM.

After that, in response to the instructions by a CPU (Central Processing Unit), for example, to the rising of a standby signal, the SRAM enters in a standby state (ST2). In response to the rising of the standby signal, the ReRAM units RM1 and RM2 are set (ST3). Specifically, the retained data of the SRAM (the potential state of the storage nodes A and B, a combination of H and L of the storage nodes A and B) at the end time of the normal operation period ST1 of the SRAM, for example, at the time of the rising of the standby signal are written in the ReRAM units RM1 and RM2. In other words, the potential state of the storage nodes A and B are stored in relation to the state of the two ReRAM units RM1 and RM2 (a combination of ON state and OFF state).

Figure 5:
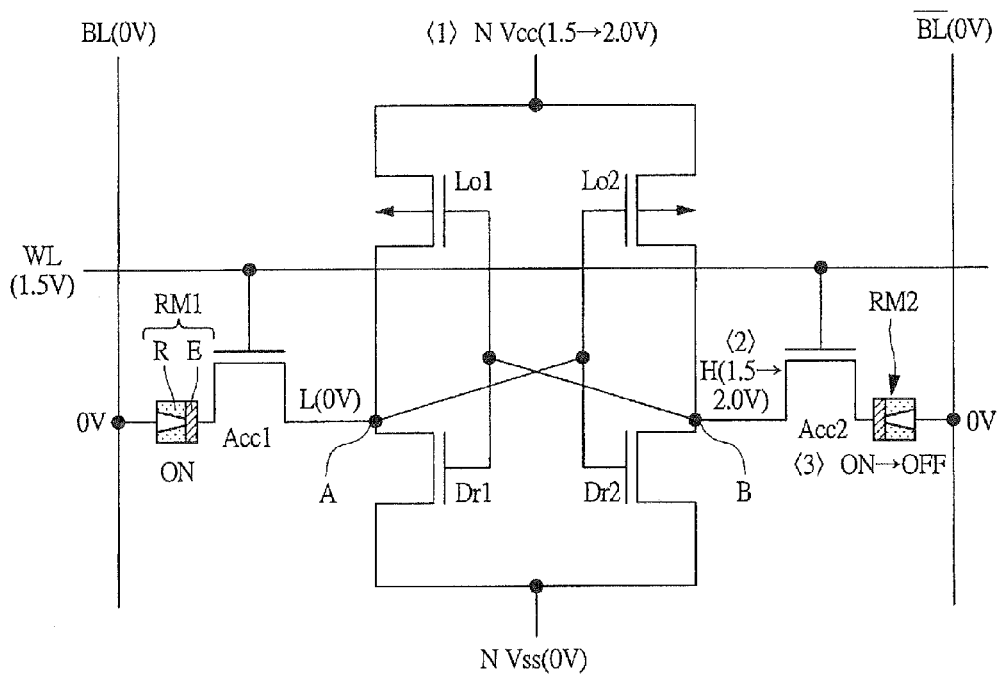
FIG. 5 is a circuit diagram illustrating an example of operation of writing retained data of the SRAM to the ReRAM unit.

FIG. 5 is a circuit diagram illustrating an example of operation of writing the retained data of the SRAM to the ReRAM unit. At the end time of the normal operation period ST1 of the SRAM, for example, when a low potential (L=0V) is held at the storage node A and the high potential (H=1.5V) is held at the storage node B, as explained with reference to FIG. 3, the ReRAM unit RM1 is set in ON state (ON), and the ReRAM unit RM2 is set in OFF state (OFF).

As described above, both of the ReRAM units RM1 and RM2 have been in ON state (ON), therefore, the ReRAM unit RM1 maintains ON state (ON) and the ReRAM unit RM2 shifts from ON state (ON) to OFF state (OFF).

Specifically, as illustrated in FIG. 5, in order to change the ReRAM unit RM2 from ON state to OFF state, <1> the potential applied to the power supply potential node NVcc is switched from the first power supply potential Vcc (1.5V) to the second power supply potential Vcc2 (2.0V). Accordingly, <2> the potential of the storage node B rises from 1.5V to 2.0V. In this case, since the word line WL is at the first power supply potential Vcc (1.5V), the second power supply potential Vcc2 (2.0V) is applied to the first end (on the side of the electrode part E) of the resistance change layer R via Acc2. On the other hand, since the bit line /BL is still at the low potential (0V) 0V is applied to the second end of the resistance change layer R. Accordingly, <3> a potential difference greater than the predetermined potential (2.0V) is produced between the first end and the second end of the resistance change layer R, and the state of the so-called "reverse bias" in which the potential applied to the first end is high occurs. Therefore, the resistance change layer R shifts to a high resistance state, and the ReRAM unit RM2 changes from ON state (ON) to OFF state (OFF) (the ReRAM unit RM2 is rewritten).

In this way, rewrite is performed by the predetermined potential (2.0V) which is higher than the first power supply potential Vcc (1.5V). When putting in another way, by employing the ReRAM unit (the resistance change layer R) which exhibits a resistance change only by the predetermined potential (2.0V) higher than the first power supply potential Vcc (1.5V), it is possible to prevent the rewrite from taking place at the time of the normal operation of the SRAM, however, it is possible to perform the write of the retained data of the SRAM to the ReRAM unit at the time of necessity.

In the ReRAM unit RM1, even when the first power supply potential Vcc (1.5V) is applied to the word line WL and Acc1 is in ON state, the line BL is at the low potential (0V) and the storage node A is maintained at the low potential (L=0V). Therefore, no potential difference is produced between the first end and the second end of the resistance change layer R. Accordingly, the ReRAM unit RM1 is not rewritten but maintains ON state (ON).

Figure 6A:
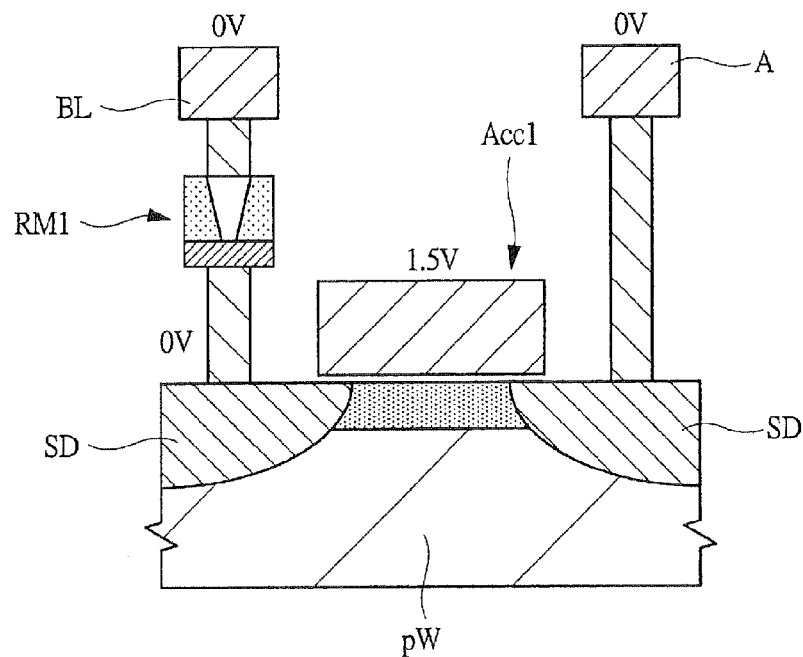
FIG. 6A and FIG. 6B are cross-sectional schematic diagrams illustrating applied voltage in writing to the ReRAM unit.
Figure 6B:
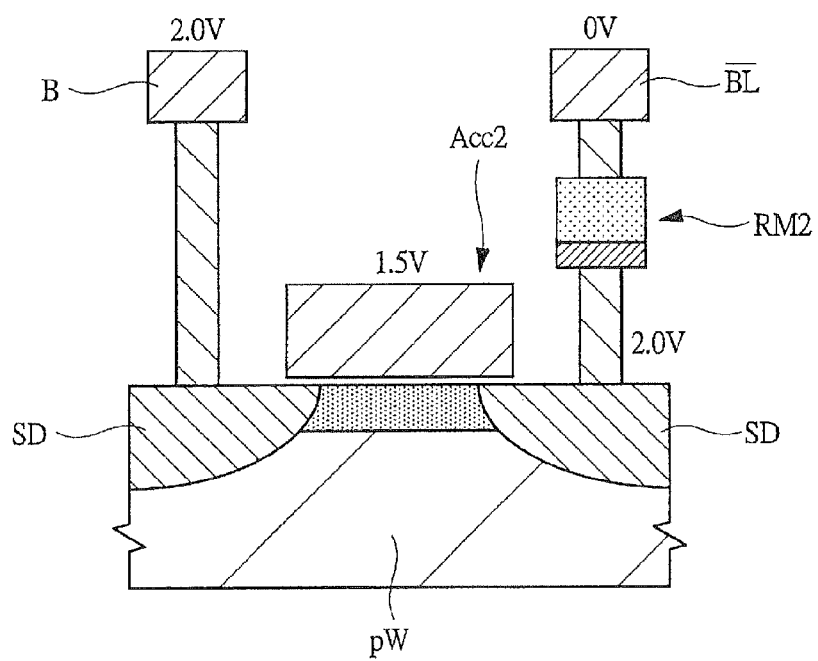

FIG. 6A and FIG. 6B are cross-sectional schematic diagrams illustrating applied voltage in writing to the ReRAM unit. FIG. 6A corresponds to the ReRAM unit RM1 illustrated in FIG. 5, and FIG. 6B corresponds to the ReRAM unit RM2 illustrated in FIG. 5.

Since the word line WL (a gate electrode) is 1.5V as illustrated in FIG. 6A, the potential (0V) of the storage node A is applied to the first end (on the side of the electrode part E) of the resistance change layer R of the ReRAM unit. RM1, via Acc1 which is in ON state. Since the potential of the bit line BL is 0V, 0V is applied to the second end of the resistance change layer R. In this way, no potential difference is produced between the first end and the second end; accordingly, rewrite does not take place and the ReRAM unit RM1 maintains ON state (ON).

Since the word line WL (a gate electrode) is 1.5V as illustrated in FIG. 6B, the potential (2.0V) of the storage node B is applied to the first end (on the side of the electrode part E) of the resistance change layer R of the ReRAM unit RM2, via Acc2 which is in ON state. Since the potential of the bit line /BL is 0V, 0V is applied to the second end of the resistance change layer R. In this way, the potential difference necessary for a resistance change is produced in the state where 0V is applied to the second end, 2.0V is applied to the first end, and where the potential applied to the first end is high. Therefore, the resistance change layer R changes to a high resistance state. Accordingly, the ReRAM unit RM2 is rewritten and shifts from ON state (ON) to OFF state (OFF).

Figure 7:
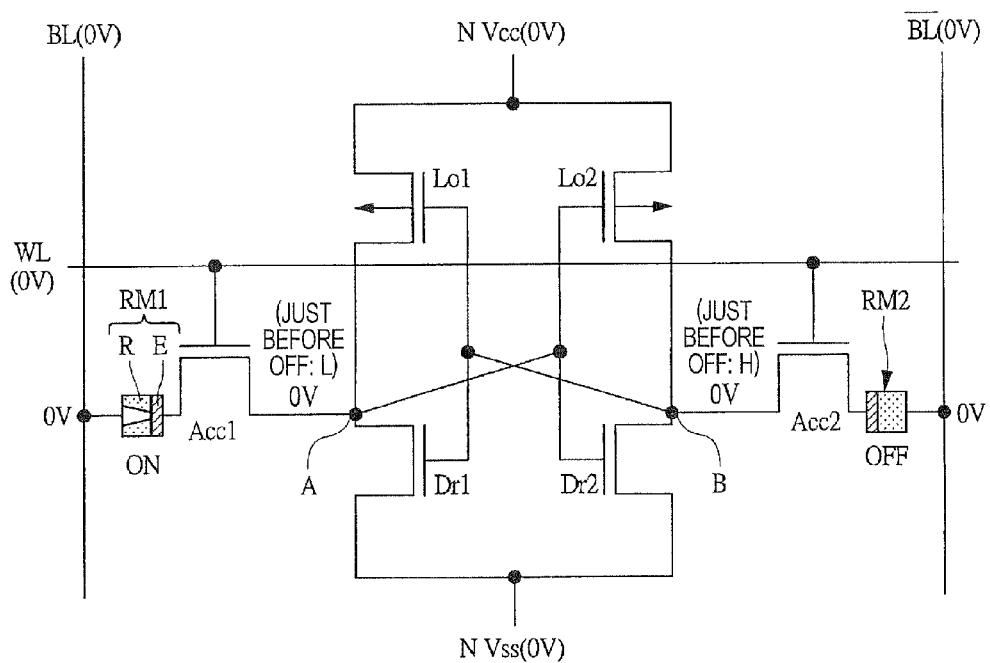
FIG. 7 is a circuit diagram illustrating potentials of each part in a power-off state.

After the write (set) of the ReRAM units RM1 and RM2 is completed, the potential applied to the power supply potential node NVcc is set to a low potential (0V), thereby entering a power-off state (standby period) (ST4, FIG. 4). FIG. 7 is a circuit diagram illustrating potentials of each part in the power-off state. As illustrated in FIG. 7, the potential applied to the power supply potential node NVcc is changed from 2.0V to 0V. In this case, the potential of the word line WL is also deactivated. That is, the potential of the word line WL changes from 1.5V to 0V, and Acc1 and Acc2 shift to OFF state. By the deactivation of the power supply potential node NVcc, the retention potential (data) of the storage nodes A and B disappears, and the potential of the storage nodes A and B changes to 0V, for example. However, the corresponding data is stored (retained) as the state of the two ReRAM units RM1 and RM2 (a combination of ON state and OFF state). In the present case, the ReRAM unit RM1 is set in ON state (ON) and the ReRAM unit RM2 is set in OFF state (OFF); thereby the potential of the storage nodes A and B immediately before the power OFF (A=L and B=H) is stored (retained).

Figure 8:
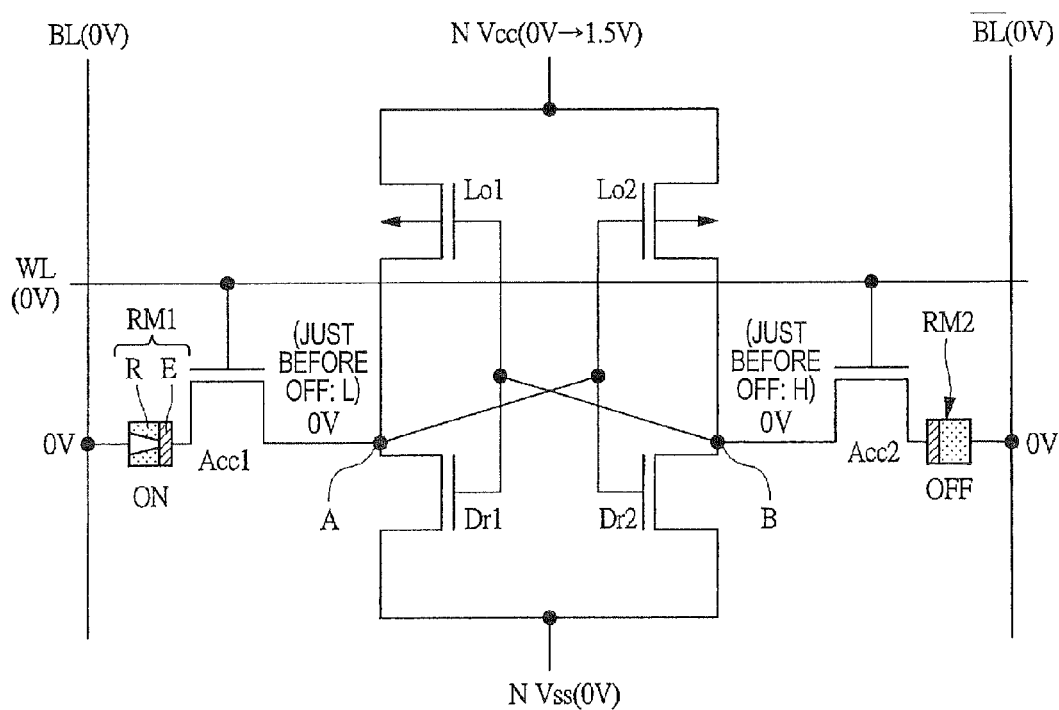
FIG. 8 is a circuit diagram illustrating change of the potentials from a power-off state to a power-on state.

Next, the following explains the case where the SRAM shifts from the standby period again to the normal operation. For example, the standby state is canceled in response to the falling of a standby signal by the instruction from the CPU (ST5, FIG. 4). In this case, in response to the falling of the standby signal, the potential applied to the power supply potential node NVcc changes from 0V to 1.5V. That is, the state shifts to a power-on state (ST6, FIG. 4). FIG. 8 is a circuit diagram illustrating change of the potentials from the power-off state to the power-on state. As illustrated in FIG. 8, the potential applied to the power supply potential node NVcc rises from 0V to 1.5V. In this case, the state of the potential of each region except for the power supply potential node NVcc is the same as the case illustrated in FIG. 7, and the potential of the storage nodes A and B is still 0V.

Next, in response to the falling of the standby signal, the data of the ReRAM units RM1 and RM2 are read (ST7, FIG. 4), and the corresponding data is written back to the storage nodes A and B. Then, both of the ReRAM units RM1 and RM2 are set in ON state (reset) (ST8, FIG. 4).

Figure 9:
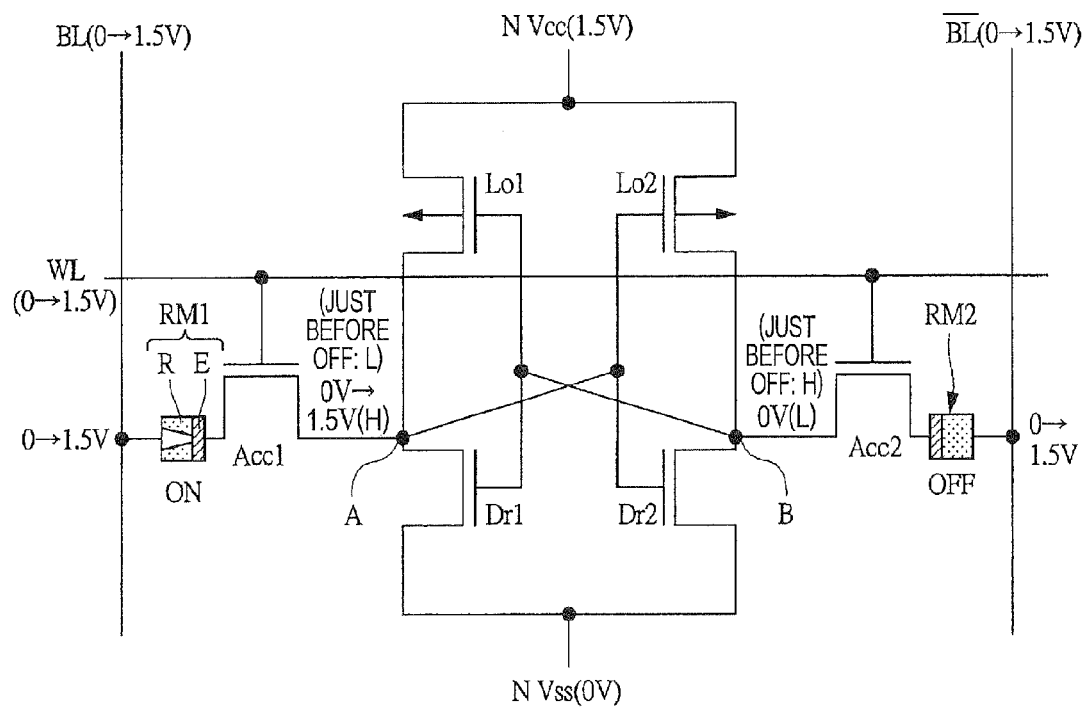
FIG. 9 is a circuit diagram illustrating a first state of a data read operation (data determination operation) in the ReRAM unit.

FIG. 9 is a circuit diagram illustrating the first state of data read operation (data determination operation) in the ReRAM unit. As illustrated in FIG. 9, the word line WL is set from 0V to a drive potential (1.5V), and both bit lines BL and /BL are set from 0V to a high potential (1.5V=H). In this case, since the ReRAM unit RM1 is in ON state (ON), the storage node A is set to H (1.5V) and Dr2 is set in ON state. Accordingly, the storage node B is set to L (0V). In this way, by setting both bit lines BL and /BL to the high potential (1.5V=H), H is written (stored) in the storage node (here A) on the side of the ReRAM unit (here RM1) which is in ON state (ON), and the storage node (here B) on the side of the ReRAM unit (here RM2) which is in OFF state (OFF) is set to L. In this way, the data transfer of the ReRAM unit can be performed in a self-matching manner (automatically), only by activating both bit lines BL and /BL from 0V to the high potential (1.5V=H). That is, the potential of the storage nodes A and B changes (here, changing to A=H and B=L), in response to the data written in the ReRAM units RM1 and RM1 (here, a combination of ON and OFF). The present state of the potential (A=H and B=L) is opposite to the state of the potential of the storage nodes A and B (A=L and B=H) immediately before the power OFF.

Figure 10:
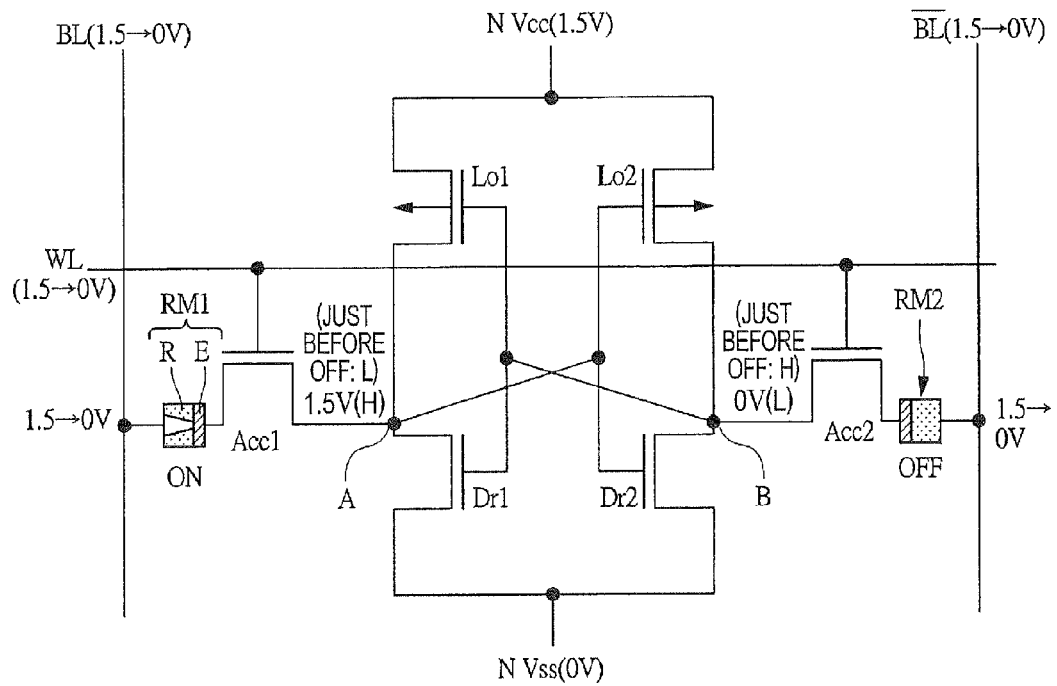
FIG. 10 is a circuit diagram illustrating a second state of the data read operation (data determination operation) in the ReRAM unit.

Next, the word line WL and the bit lines BL and /BL are deactivated. FIG. 10 is a circuit diagram illustrating the second state of data read operation (data determination operation) in the ReRAM unit. As illustrated in FIG. 10, the word line WL and the bit lines BL and /BL are deactivated, from 1.5V to 0V. In this way, even when the word line WL and the bit lines BL and /BL are deactivated, the potential corresponding the data written in the ReRAM units RM1 and RM2 are maintained in the storage nodes A and B.

Figure 11:
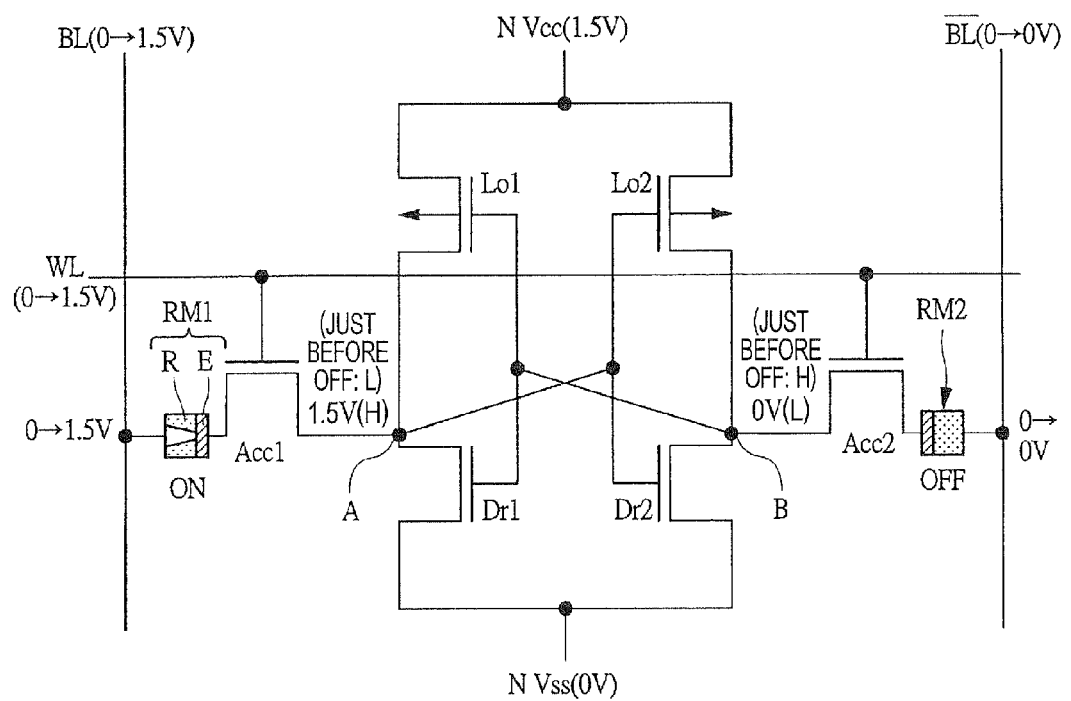
FIG. 11 is a circuit diagram illustrating a third state of the data read operation (data determination operation) in the ReRAM unit.

Next, the word line WL is activated from 0V to 1.5V, and the potential of the storage nodes A and B is transferred to the bit lines BL and /BL via Acc1 and Acc2. That is, the data of the ReRAM unit is read. FIG. 11 is a circuit diagram illustrating the third state of data read operation (data determination operation) in the ReRAM unit. As illustrated in FIG. 11, the potential of the bit lines BL and /BL changes in response to the activation of the word line WL. In the present case, the bit line BL changes from 0V to 1.5V (H), and the bit line /BL maintains 0V. By the change of the potential of the bit lines, it turns out that the storage node A has been H and the ReRAM unit RM1 on the side of the storage node A has been in ON state. In this way, it is possible to determine (to read) which of the ReRAM units RM1 and RM2 has been in ON state, based on the potential appearing in the bit lines BL and /BL. In other words, when the potential of the bit lines BL and /BL is the combination of H and L, respectively, it turns out that the ReRAM unit RM1 on the side of the bit line EL has been in ON state, that is, the storage node A has been in L state immediately before the power OFF. Conversely, when the potential of the bit lines BL and /BL is the combination of L and H, respectively, it turns out that the ReRAM unit RM2 on the side of the bit line /BL has been in ON state, that is, the storage node B has been in L state immediately before the power OFF. In this way, it is possible to determine the state of the potential of the storage nodes A and B immediately before the power OFF, by reading the data of the ReRAM units RM1 and RM2 (ST7).

Figure 12:
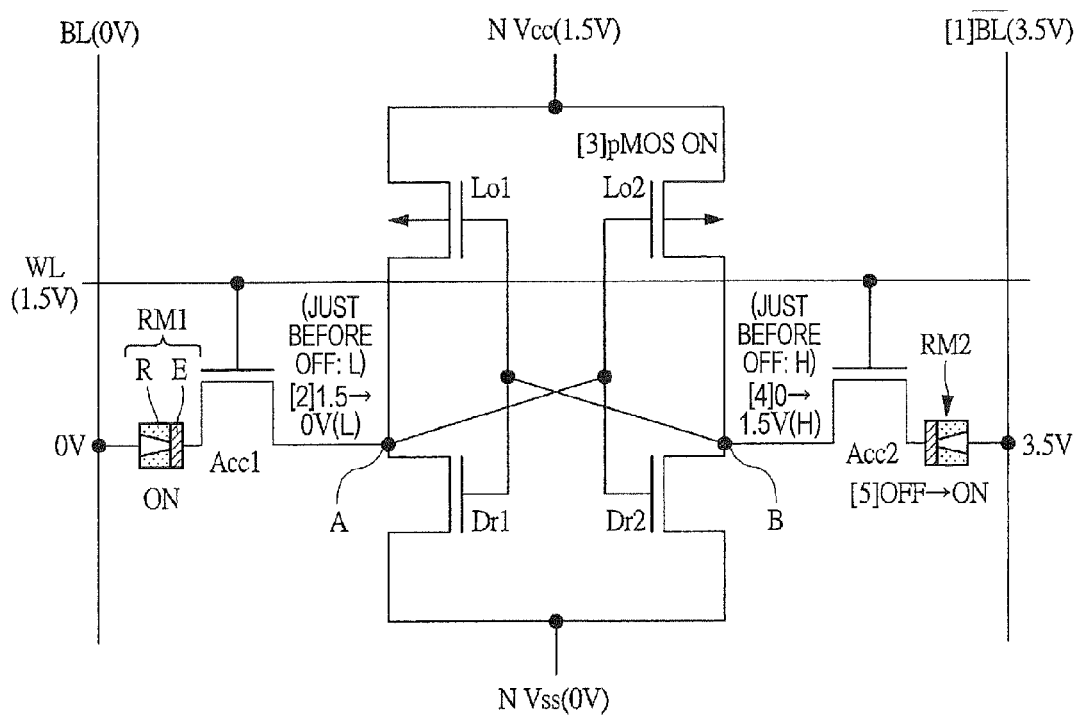
FIG. 12 is a circuit diagram illustrating an example of a write operation of the retained data of the ReRAM unit to the SRAM.

Next, the data read from the ReRAM units RM1 and RM2 is written back to the storage nodes A and B (ST8). In other words, the data based on determining of the potential of the storage node A and B immediately before the power OFF (here A=L and B=H) is written back to the storage nodes A and B. FIG. 12 is a circuit diagram illustrating an example of the write operation (data restore operation) of the retained data of the ReRAM units to the SRAM.

As illustrated in FIG. 12, on the basis of determining of the potential of the storage nodes A and B immediately before the power OFF (here A=L and B=H), 0V is applied to the bit line BL and a third power supply potential (3.5V) is applied to the bit line /BL. Specifically, in the power-on state in which the potential applied to the power supply potential node NVcc is 1.5V, [1] the bit line /BL on the side of the ReRAM unit (here RM2) which has been in OFF state (OFF), in other words, the bit line /BL on the side of the storage node B in which "H" has been held immediately before the power OFF, is raised to the third power supply potential (3.5V). The third power supply potential Vcc3 is a potential higher than the first power supply potential Vcc (here 1.5V) by the predetermined potential (here 2.0V), and a potential higher than the second power supply potential Vcc2. On the other hand, the bit line BL on the side of the ReRAM unit (here RM1) which has been in ON state (ON), in other words, the bit line BL on the side of the storage node A in which "L" has been held immediately before the power OFF, is set to a low potential (0V). At this time, the word line WL has risen to 1.5V. [2] The ReRAM unit (here RM1) is in ON state (ON), accordingly, the potential (0V) of the bit line BL is transferred to the storage node A, and the potential of the storage node A becomes from 1.5V to 0V (L). Thereby, [3] Lo2 becomes in ON state, accordingly, [4] the storage node B becomes from 0V to 1.5V (H). In this way, the storage node A is set to L, the storage node B is set to H, and the retained data (that is, the potential of the storage nodes A and B immediately before the power OFF) are written back to the storage nodes A and B.

Furthermore, the potential (1.5V) of the storage node B is applied to the first end (on the side of the electrode part E) of the resistance change layer R. On the other hand, the potential (3.5V) of the bit line /BL is applied to the second end of the resistance change layer R, and in the resistance change layer R, the potential difference necessary for a resistance change is produced in the state where the potential applied to the first end is lower. Therefore, the resistance change layer R changes to a low resistance state. Accordingly, [5] the ReRAM unit RM2 is rewritten and the state thereof shifts from OFF state (OFF) to ON state (ON). Accordingly, the data is written back to the SRAM, and at the same time, both of the ReRAM units RM1 and RM2 become in ON state (ON), that is, both are reset. After this moment, the normal operation of the SRAM becomes possible. That is, the normal operation, data holding, read, write, etc. of the SRAM become possible, and the SRAM will return to the normal operation period ST1 described above.

Figure 13A:
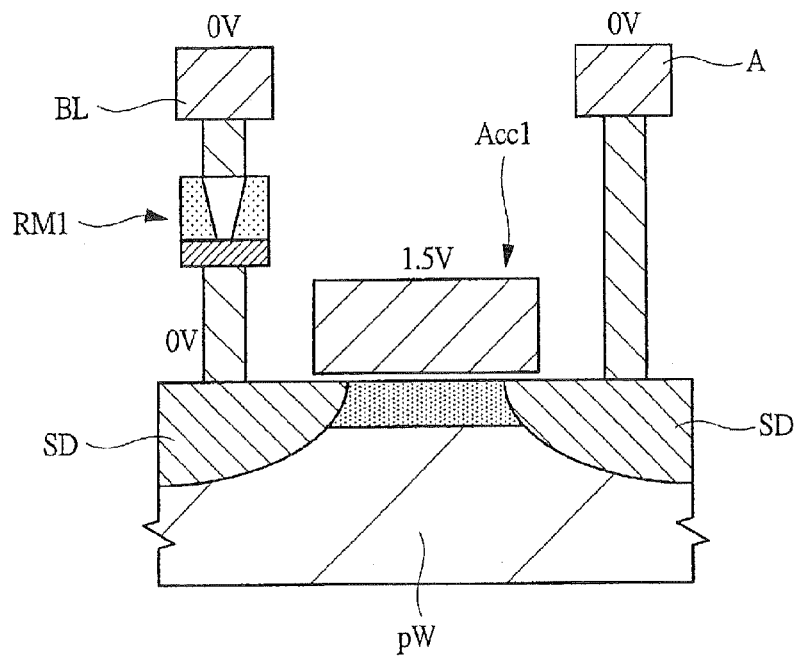
FIG. 13A and FIG. 13B are cross-sectional schematic diagrams illustrating applied voltage in resetting the ReRAM unit.
Figure 13B:
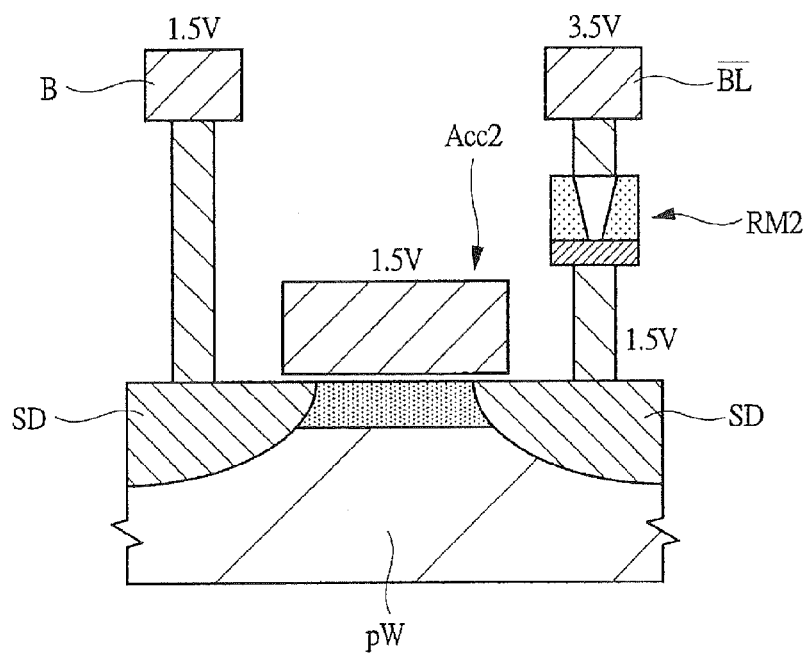

FIG. 13A and FIG. 13B are cross-sectional schematic diagrams illustrating applied voltage in resetting the ReRAM unit. FIG. 13A corresponds to the ReRAM unit RM1 illustrated in FIG. 12, and FIG. 13B corresponds to the ReRAM unit RM2 illustrated in FIG. 12.

As illustrated in FIG. 13A, since the word line WL (gate electrode) is 1.5V, the potential (0V) of the storage node A is applied to the first end (on the side of the electrode part E) of the resistance change layer R of the ReRAM unit RM1, via Acc1 which is in ON state. Since the potential of the bit line BL is 0V, 0V is applied to the second end of the resistance change layer R. In this way, no potential difference is produced between the first end and the second end; accordingly, rewrite does not take place and the ReRAM unit RM1 maintains ON state (ON).

As illustrated in FIG. 13B, since the word line WL (gate electrode) is 1.5V, the potential (1.5V) of the storage node B is applied to the first end (on the side of the electrode part E) of the resistance change layer R of the ReRAM unit RM2, via Acc2 which is in ON state. Since the potential of the bit line BL is 3.5V, 3.5V is applied to the second end of the resistance change layer R. In this way, a potential difference necessary for a resistance change is produced in the state where 3.5V is applied to the second end, 1.5V is applied to the first end, and the potential which is applied to the first end is lower. Therefore, the resistance change layer R changes to a low resistance state. Accordingly, the ReRAM unit RM2 is rewritten and the state thereof shifts from OFF state (OFF) to ON state (ON).

In this way, according to the present embodiment, by providing the ReRAM unit in the SRAM, it is possible to continue storing the data held in the flip-flop unit of the SRAM in the power-off state (standby state). Conversely, by making the ReRAM unit store the data held in the flip-flop unit of the SRAM, it becomes easy to turn off the power supply of the SRAM, leading to reduction of the consumption current. That is, since the SRAM is a volatile memory, it is necessary to continue supplying an electric power, in order to continue holding the data. However, when a SRAM function is not used, for example, when other memories are mainly operated, it is possible to put the SRAM concerned into a standby state and to attain the low power consumption of the device.

<<Device Structure>>

Next, the structure of the semiconductor memory device according to the present embodiment is explained, with reference to a sectional view and a plan view.

Figure 18:
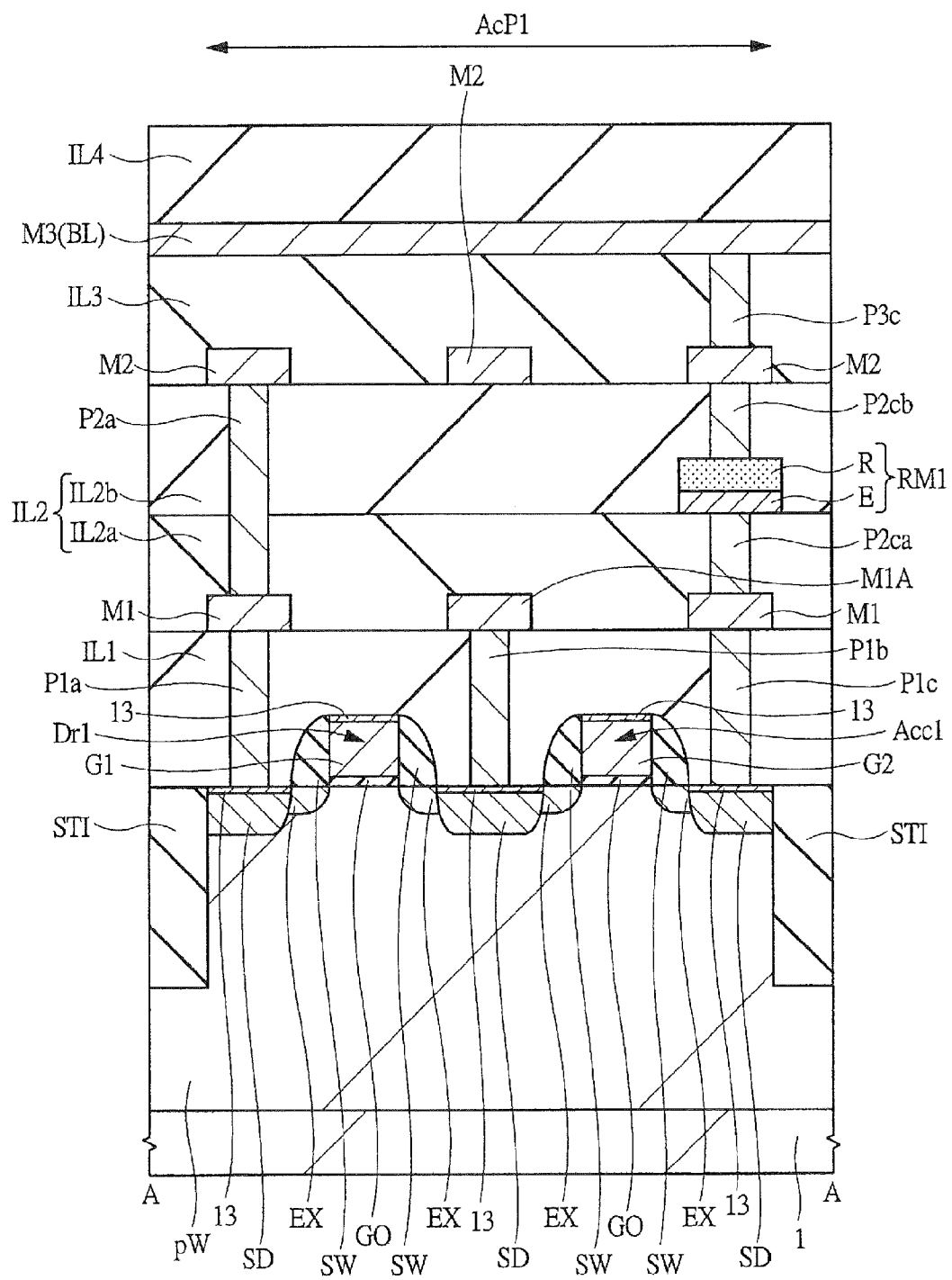
FIG. 18 is a sectional view illustrating a configuration of a memory cell of the semiconductor memory device according to the present embodiment.
Figure 19:
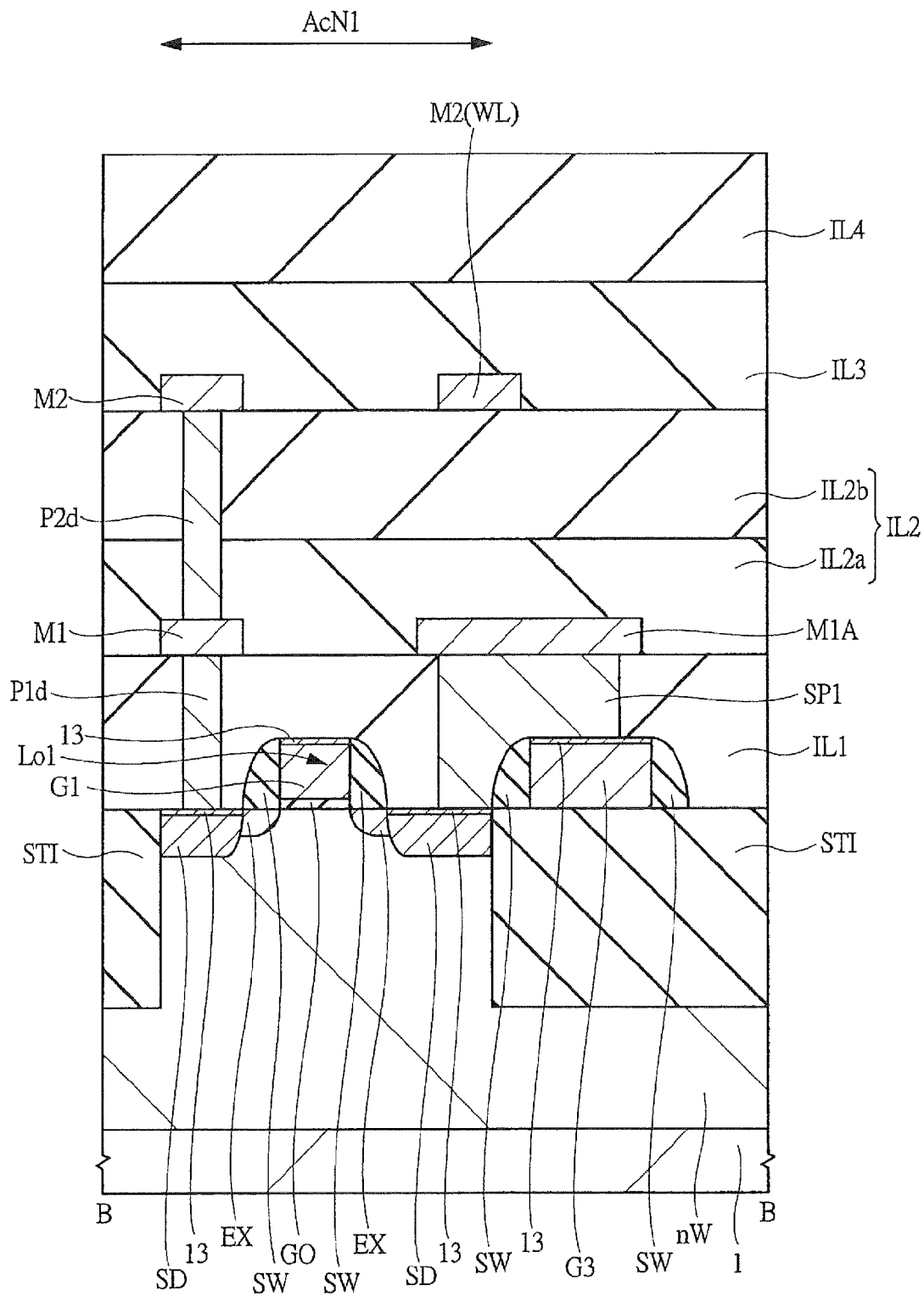
FIG. 19 is a sectional view illustrating a configuration of a memory cell of the semiconductor memory device according to the present embodiment.

FIGS. 14-17 are plan views illustrating the configuration of a memory cell of the semiconductor memory device according to the present embodiment. FIGS. 18 and 19 are sectional views illustrating the configuration of a memory cell of the semiconductor memory device according to the present embodiment. FIG. 18 corresponds to an A-A cross section of FIG. 14, and FIG. 19 corresponds to a B-B cross section of FIG. 14. In the plan views, the positional relationship of patterns displayed in each drawing will become clear by overlapping each drawing, with reference to a memory cell area MCA. In the present specification, only the sectional view of active areas AcP1 and AcN1 to be described later is illustrated for simplification of a drawing. However, the cross section corresponding to the active areas AcP2 and AcN2 also has the similar structure.

As illustrated in FIGS. 18 and 19, the memory cell of the semiconductor memory device (the SRAM with the built-in ReRAM unit) according to the present embodiment is formed over a semiconductor substrate 1. An element isolation area STI is arranged over the semiconductor substrate 1, and an area divided by the element isolation area STI serves as an active area (also called an element formation area, a semiconductor area) Ac.

Figure 14:
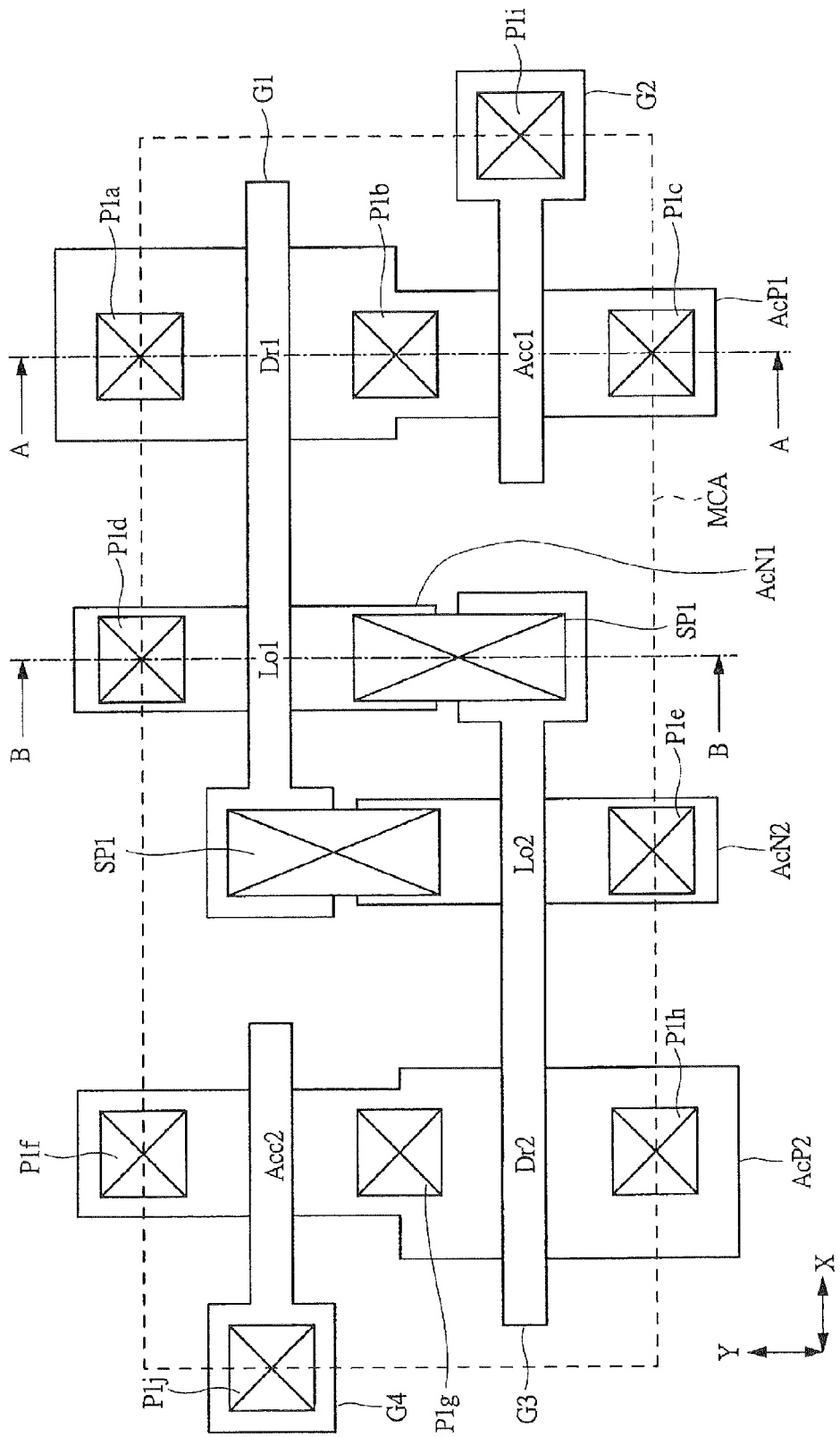
FIG. 14 is a plan view illustrating a configuration of a memory cell of the semiconductor memory device according to the present embodiment.

An approximately rectangular area enclosed with a dashed line illustrated in FIG. 14 is one (1 bit) memory cell area MCA. As illustrated in the figure, four active areas (AcP1, AcN1, AcN2, AcP2) are arranged in sequence along the X direction. Here, a mark is added to the symbol "Ac" indicative of the active area to identify an individual area. An area between these active areas (Ac) is the element isolation area (STI). In other words, as described above, the active area (Ac) is divided by the element isolation area (STI).

A well (a semiconductor area, nW, pW) is arranged in the semiconductor substrate 1 of the active area (Ac) (refer to FIG. 18 and FIG. 19). In other words, the active area (Ac) corresponds to an exposed area of the well. A p-type well pW of the well (nW, pW) is arranged at respective lower parts of two active areas (AcP1, AcP2), and an n-type well nW is arranged at respective lower parts of two active areas (AcN1, AcN2).

As illustrated in FIG. 14, the active area AcP1 has the form of a line which extends in the Y direction. Specifically, the form of a line has the X-direction width in an arrangement part of a driver transistor Dr1 described later broader than the X-direction width in an arrangement part of the access transistor Acc1. In FIG. 14, the form of a line has the broader width in the upper part. The p-type well pW is arranged in the lower part of the active area AcP1 (refer to FIG. 18).

The active area AcN1 has the form of a rectangle with a long side in the Y direction (FIG. 14). The n-type well nW is arranged in the lower part of the active area AcN1 (refer to FIG. 19).

The active area AcN2 has the form of a rectangle with a long side in the Y direction (FIG. 14). The n-type well nW is arranged in the lower part of the active area AcN2 (refer to FIG. 19).

The active area AcP2 has a form of a line which extends in the Y direction. Specifically, the form of a line has the X-direction width in an arrangement part of a driver transistor Dr2 described later broader than the X-direction width in an arrangement part of the access transistor Acc2. In FIG. 14, the form of a line has the broader width in the lower part. The p-type well pW is arranged in the lower part of the active area AcP2 (refer to FIG. 18).

As illustrated in FIG. 14, over the four active areas (AcP1, AcN1, AcN2, AcP2), via gate insulating films (GO, refer to FIG. 18, FIG. 19, etc.), gate electrodes (gate wiring) G (G1-G4) extend and cross each active area in the X direction, accordingly, forming six transistors explained in the "circuit configuration" described above. The active area (Ac) on both sides of the gate electrode G serves as a source-drain area of a transistor (refer to FIG. 18, FIG. 19, etc.).

Specifically, a common gate electrode G1 is arranged to cross over the active areas AcP1 and AcN1. Accordingly, Dr1 is arranged over the active area AcP1 and Lo1 is arranged over the active area AcN1, and these gate electrodes (G) are coupled together. This common gate electrode G1 extends to near the active area AcN2 and is coupled to the source-drain area of Lo2 by a shared plug SP1 to be described later (refer to FIG. 19).

Over the active area AcP1, a gate electrode G2 is arranged in parallel with the common gate electrode G1 described above. Accordingly, over the active area AcP1, Acc1 is arranged and the source-drain area of Dr1 and the source-drain area of Acc1 are coupled (communalized).

A common gate electrode G3 is arranged to cross over the active areas AcP2 and AcN2. Accordingly, Dr2 is arranged over the active area AcP2 and Lo2 is arranged over the active area AcN2, and these gate electrodes (G) are coupled together. This common gate electrode G3 extends to near the active area AcN1 and is coupled to the source-drain area of Lo2 by a shared plug SP1 to be described later.

Over the active area AcP2, a gate electrode G4 is arranged in parallel with the common gate electrode G3 described above. Accordingly, over the active area AcP2, Acc2 is arranged and the source-drain area of Dr2 and the source-drain area of Acc2 are coupled (communalized).

The four gate electrodes G1-G4 are arranged two by two over an identical line (in alignment). Specifically, the common gate electrode G1 which crosses over the active areas AcP1 and AcN1, and the gate electrode G4 over the active area AcP2 are arranged over an identical line which extends in the X direction. The common gate electrode G3 which crosses over the active areas AcP2 and AcN2, and the gate electrode G2 over the active area AcP1 are arranged over an identical line which extends in the X direction.

Over the source-drain areas of the six transistors (Dr1, Acc1, Lo1, Lo2, Acc2, Dr2), first plugs P1 (P1a-P1h) are arranged (FIG. 14). The first plugs (coupling section) P1 are a plug coupled to a first layer wiring M1 described later. The first plugs P1 are arranged also over the four gate electrodes (G1-G4). Since the first plugs P1 over the gate electrodes G1 and G3 are the first plugs which configure a "shared plug", they are indicated as the "SP1" as described above. The first plugs P1 over the gate electrodes G2 and G4 are indicated as P1i and P1j, respectively.

Figure 15:
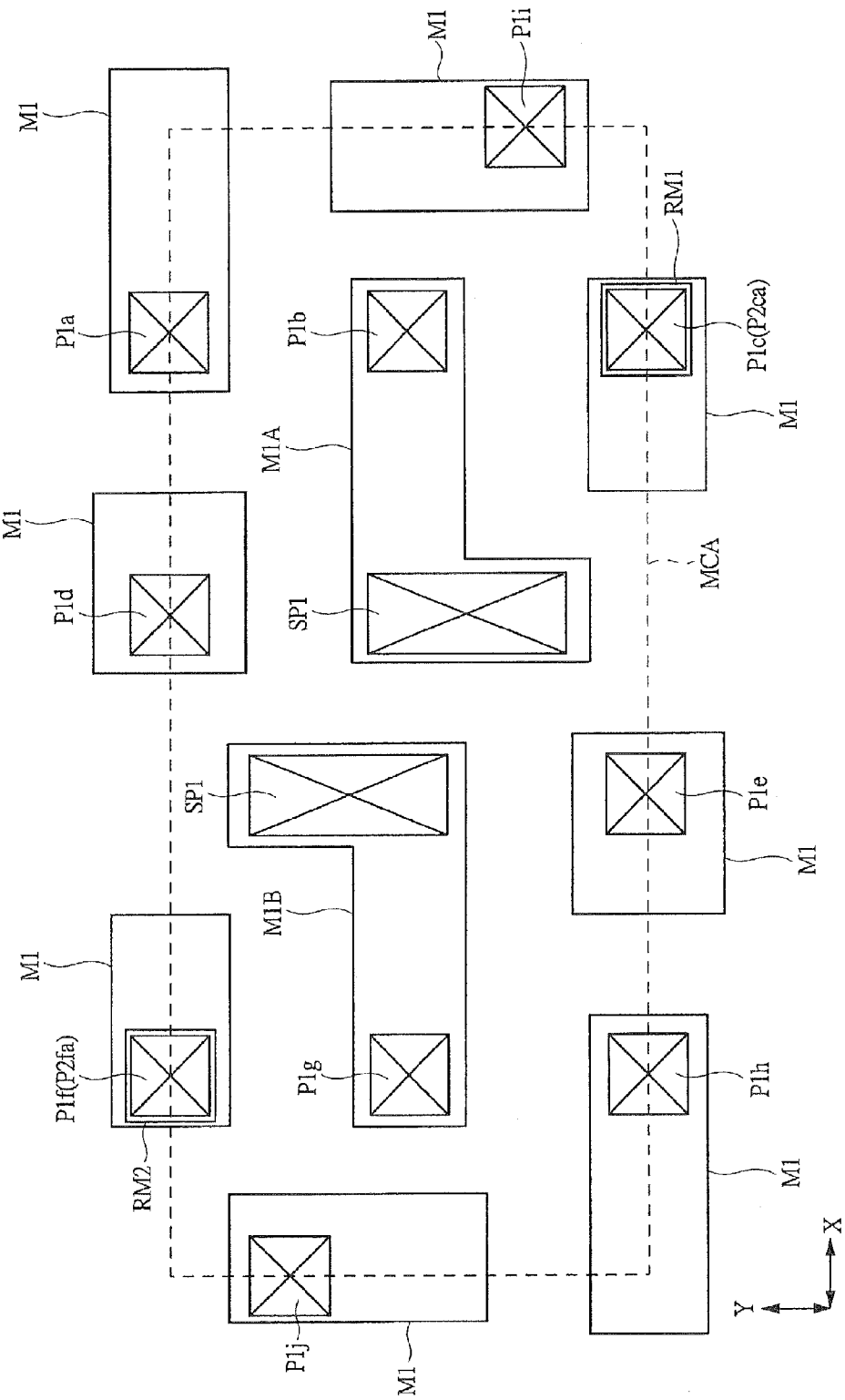
FIG. 15 is a plan view illustrating a configuration of a memory cell of the semiconductor memory device according to the present embodiment.

The first layer wiring M1 is arranged over the first plugs P1 (P1a-P1j, SP1) (refer to FIG. 15). A multi wiring layer is arranged further over the first layer wiring M1. For example, second plugs P2 and a second layer wiring M2 are arranged over the first layer wiring M1, (refer to FIG. 16), and a third plugs P3, a third layer wiring M3, etc. are arranged over the second layer wiring M2 (refer to FIG. 17). Electrical coupling among the first plugs P1 is accomplished via these wirings, and electrical coupling among the transistors illustrated in FIG. 1 is attained.

In the present embodiment, as illustrated in FIG. 15, the ReRAM units RM1 and RM2 are arranged over the first plugs P1c and P1f, respectively. The first plug P1c corresponds to the one end (source-drain area) of Acc1. The other end of the Acc1 is coupled to a first layer wiring M1A associated with the storage node A as described later. That is, the ReRAM unit RM1 is arranged between the bit line BL and the other end (source-drain area, specifically a second plug P2ca described later) of Acc1 which has one end (source-drain area) coupled to the storage node A.

The first plug P1f corresponds to the one end (source-drain area) of Acc2. The other end of the Acc2 is coupled to a first layer wiring M1B associated with the storage node B as described later. That is, the ReRAM unit RM2 is arranged between the bit line /BL and the other end (source-drain area, specifically a second plug P2fa described later) of Acc2 which has one end (source-drain area) coupled to the storage node B.

As long as the coupling state among the transistors illustrated in FIG. 1 is fulfilled, there is no restriction in a concrete coupling form among the first plugs P1, for example, in the layout of the first layer wiring M1, the second plug P2, the second layer wiring M2, the third plug P3, the third layer wiring M3, and others. The following explains an example of the layout.

As illustrated in FIG. 15, the first layer wiring M1 is arranged so as to couple the shared plug (shared contact) SP1 over the common gate electrode G3 of Lo2 and Dr2, to the first plug P1*b* over the common source-drain area of Dr1 and Acc1. Since the present first layer wiring M1 can be associated with the storage node A of FIG. 1, the present first layer wiring M1 is designated as M1A.

The first layer wiring M1 is arranged so as to couple the shared plug (shared contact) SP1 over the common gate electrode G1 of Lo1 and Dr1, to the first plug P1*g* over the common source-drain area of Dr2 and Acc2. Since the present first layer wiring M1 can be associated with the storage node B of FIG. 1, the present first layer wiring M1 is designated as M1B.

The first layer wiring (pad region) M1 is arranged over each of the first plugs P1*a*, P1*c*, P1*d*, P1*e*, P1*f*, P1*h*, P1*i*, and P1*j*. The second plugs P2 (P2*a*, P2*c*, P2*d*, P2*e*, P2*f*, P2*h*, and two P2*w*) are arranged over each first layer wiring M1 (FIG. 15, FIG. 16).

Here, the second plug P2*c* is formed by P2*ca* and P2*cb*, between which the ReRAM unit RM1 is arranged. Specifically, the second plug P2*ca* is arranged over the first layer wiring M1 over the first plug P1*c*, and over the second plug P2*ca*, an electrode part E and an upper resistance change layer R which form the ReRAM unit RM1 are arranged, and furthermore the second plug P2*cb* is arranged over the resistance change layer R (refer to FIG. 15, FIG. 16, and FIG. 18). The second plug P2*f* is formed by P2*fa* and P2*fb*, between which the ReRAM unit RM2 is arranged. Specifically, the second plug P2*fa* is arranged over the first layer wiring M1 over the first plug P1*f*, and over the second plug P2*fa*, an electrode part E and an upper resistance change layer R which form the ReRAM unit RM2 are arranged, and furthermore the second plug P2*fb* is arranged over the resistance change layer R (refer to FIG. 15 and FIG. 16).

Figure 16:
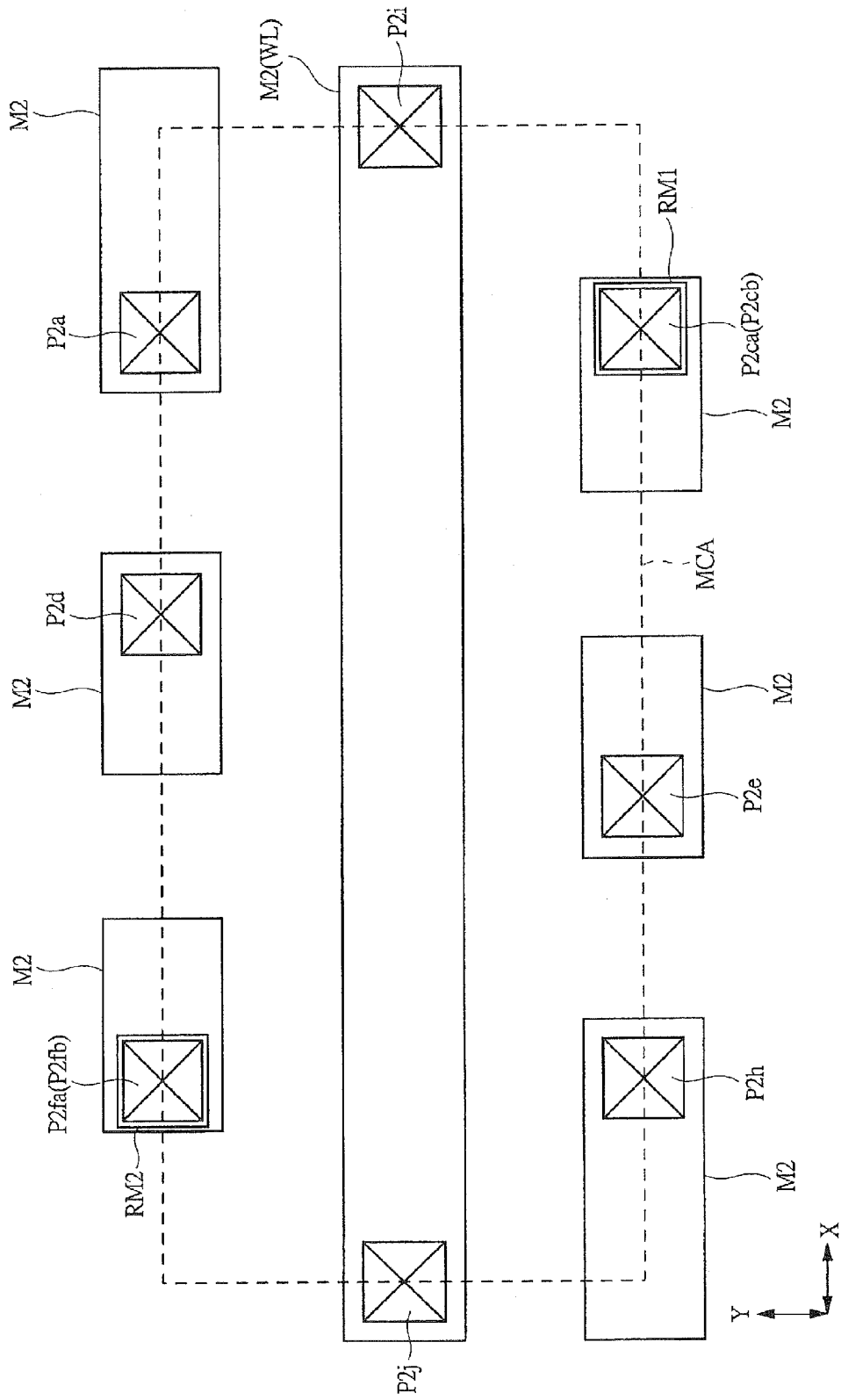
FIG. 16 is a plan view illustrating a configuration of a memory cell of the semiconductor memory device according to the present embodiment.

As illustrated in FIG. 16, the second layer wiring M2 is arranged between two second plugs P2*i* and P2*j*, extending in the X direction. The present second layer wiring M2 serves as the word line WL.

The second layer wiring (pad region) M2 is arranged over each of the other second plugs P2 (P2*a*, P2*cb*, P2*d*, P2*e*, P2*fb*, P2*h*).

Figure 17:
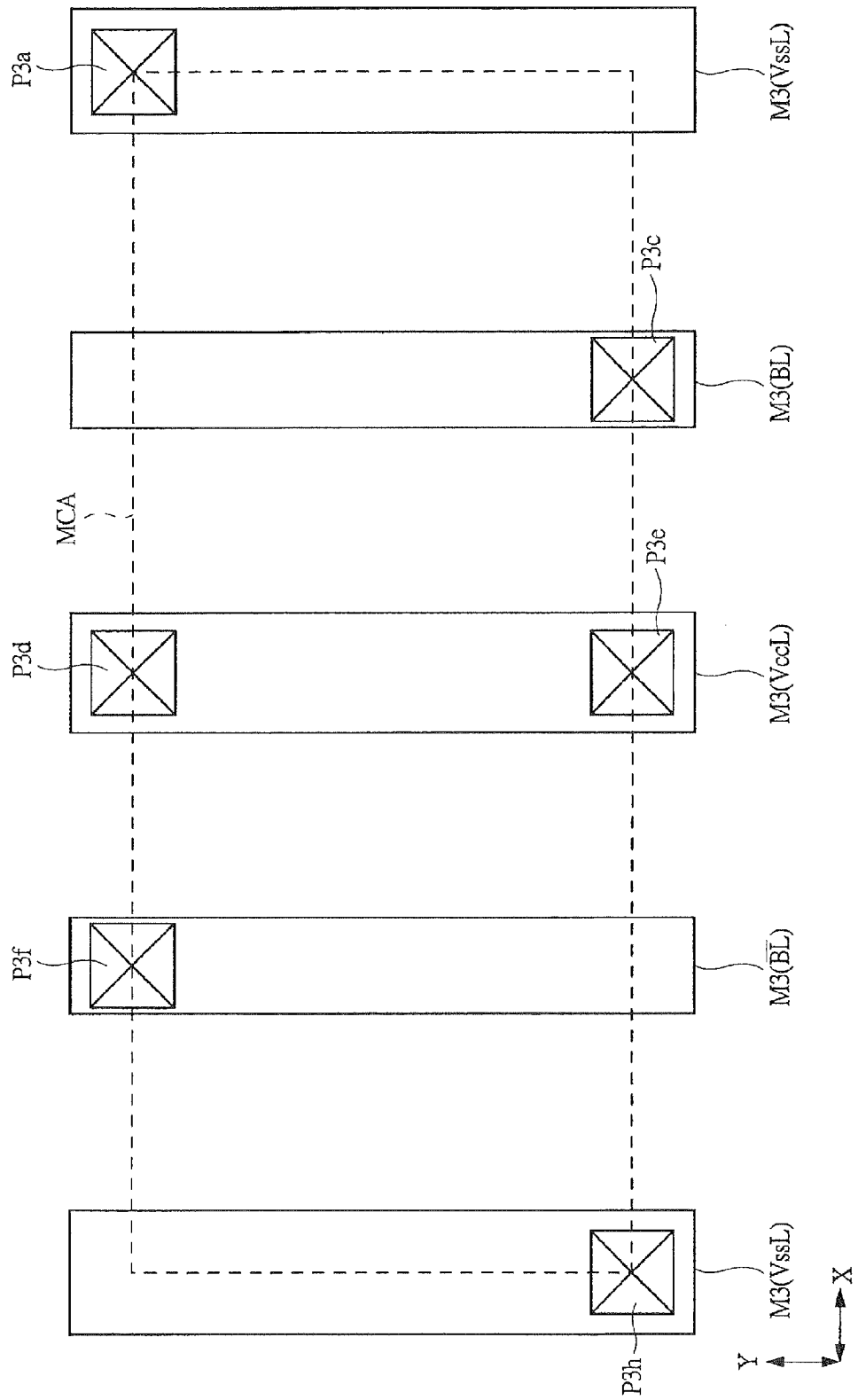
FIG. 17 is a plan view illustrating a configuration of a memory cell of the semiconductor memory device according to the present embodiment.

As illustrated in FIG. 17, the third plugs P3 (P3*a*, P3*c*, P3*d*, P3*e*, P3*f*, P3*h*) are arranged over respective second layer wiring M2.

The third layer wiring M3 is arranged between the third plugs P3*d* and P3*e* which are coupled to the first plugs P1*d* and P1*e*, extending in the Y direction. The present third layer wiring M3 serves as a power supply potential line (VccL). The power supply potential line (VccL) is coupled to the power supply potential node NVcc, and is supplied with the first, the second, and the third power supply potential.

The third layer wiring M3 is arranged over the third plug P3*a* which is coupled to the first plug P1*a*, extending in the Y direction, and the third layer wiring M3 is arranged over the third plug P3*h* which is coupled to the first plug P1*h*, extending in the Y direction. These two third layer wirings M3 serve as a reference potential line (VssL, ground potential line), respectively.

The third layer wiring M3 is arranged over the third plug P3*c* which is coupled to the first plug P1*c*, extending in the Y direction, and the third layer wiring M3 is arranged over the third plug P3*f* which is coupled to the first plug P1*f*, extending in the Y direction. These two third layer wirings M3 serve as the bit lines (BL and /BL).

<<Manufacturing Process>>

Next, the manufacturing process of the semiconductor memory device according to the present embodiment is explained, with reference to the sectional views illustrated in FIGS. 20-27, and the configuration of the semiconductor memory device according to the present embodiment is clarified more. FIGS. 20-27 are sectional views illustrating manufacturing process of the semiconductor memory device according to the present embodiment.

Figure 20:
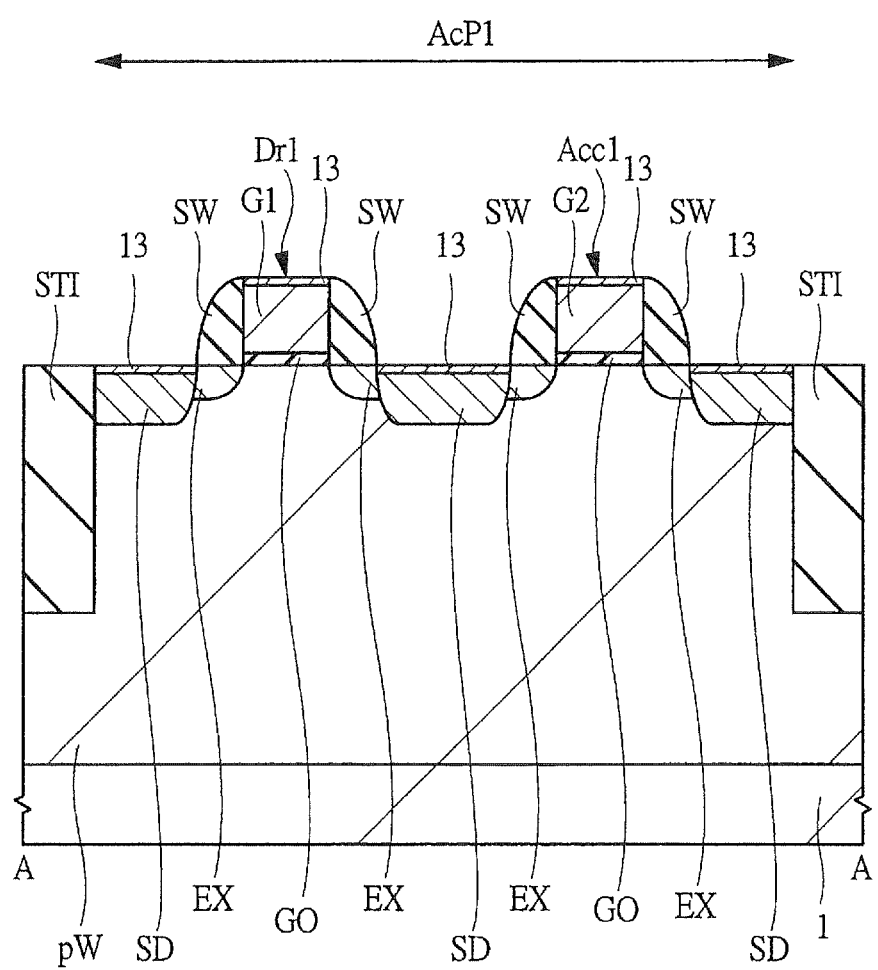
FIG. 20 is a sectional view illustrating manufacturing process of the semiconductor memory device according to the present embodiment.
Figure 21:
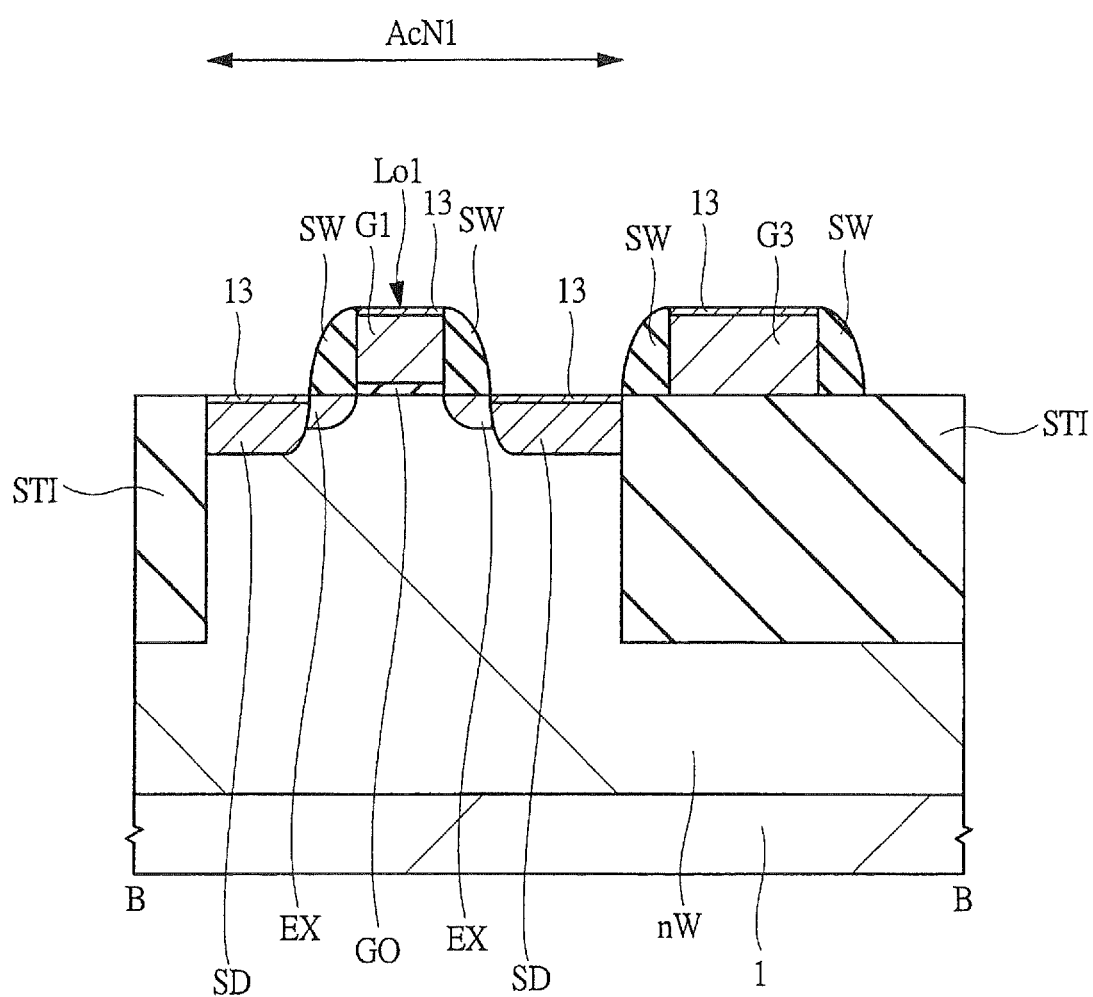
FIG. 21 is a sectional view illustrating manufacturing process of the semiconductor memory device according to the present embodiment.

As illustrated in FIGS. 20 and 21, the element isolation area STI is formed in the semiconductor substrate 1 which is a p-type single crystal silicone substrate, for example. The active area (Ac) is divided by the element isolation area STI.

The element isolation area STI can be formed by employing the STI (shallow trench isolation) method, for example. That is, an element isolation groove is formed in the semiconductor substrate 1 using photolithography technique and etching technique. Next, an insulating film such as a silicon oxide film is formed over the semiconductor substrate 1 so as to bury the element isolation groove, by employing the CVD (Chemical Vapor Deposition) method, etc. After that, an unnecessary silicon oxide film formed over the semiconductor substrate 1 is removed by a chemical-mechanical planarization (CMP) process. Accordingly, the element isolation area STI with a silicon oxide film embedded only in the element isolation groove can be formed.

Next, a p-type well pW and an n-type well nW are formed in the semiconductor substrate 1. The p-type well pW is formed by introducing a p-type impurity into the semiconductor substrate 1, by employing an ion injection method, for example. The n-type well nW is formed by introducing an n-type impurity into the semiconductor substrate 1, by employing an ion injection method, for example. In introducing the impurity, it is needless to say that impurity introduction into an unnecessary area due to the impurity injection is prevented by forming a suitable photoresist film (mask layer).

Next, each of the transistors (Acc1, Dr1, Lo1, Acc2, Dr2, Lo2) is formed over the main surface of the active area (Ac) which is an exposed area of the p-type well pW and the n-type well nW.

First, a gate insulating film GO is formed over the main surface of the active area (Ac). As the gate insulating film GO, a silicon oxide film for example can be employed. For example, the silicon oxide film is formed over the surface of the active area (Ac) by employing a thermal oxidation method. The silicon oxide film may be alternatively formed by employing a CVD method. It is preferable to employ a silicon oxynitride film in lieu of the silicon oxide film. It is also preferable to form the gate insulating film GO by use of a high dielectric constant film (high-k film). It is also preferable to form the gate insulating film GO by use of a laminate film which is comprised of a lower-layer silicon oxide film and an upper-layer high-dielectric constant film (high-k film).

Next, a gate electrode G comprised of a conductive film is formed over the gate insulating film GO. As the gate electrode G, a polycrystalline silicon film for example can be employed. For example, the polycrystalline silicon film is deposited over the gate insulating film GO, by a CVD method, etc. Next, a photoresist film is formed over the polycrystalline silicon film, exposed, and developed, then the polycrystalline silicon film with the photoresist film acting as a mask is etched, and the gate electrode G is formed. From the formation process of the photoresist film to the etching process may be called patterning. It is preferable to employ a metal film as the gate electrode G. It is also preferable to form the gate electrode G by employing a laminate film which is comprised of a lower-layer metal film and an upper-layer polycrystalline silicon film. In this way, it is preferable to adopt the so-called metal gate structure which employs a metal (including a compound with metallic conductivity) as the gate electrode.

Next, an n-type low-concentration impurity region EX is formed in the active areas AcP1 and AcP2 and the p-type well pW on both sides of the gate electrode G. The n-type low-concentration impurity region EX is formed by an ion injection method, by introducing an n-type impurity into the active area (AcP1, AcP2, pW) with the gate electrode G as a mask. Next, a p-type low-concentration impurity region EX is formed in the active areas AcN1 and AcN2 and the n-type well nW on both sides of the gate electrode G. The p-type low-concentration impurity region EX is formed by an ion injection method, by introducing a p-type impurity into the active area (AcN1, AcN2, nW) with the gate electrode G as a mask.

Next, a sidewall film SW is formed in the side wall of both sides of the gate electrode G. For example, an insulating film formed by a laminate film which is comprised of a lower-layer silicon oxide film and an upper-layer silicon nitride film is deposited over the gate electrode G by a CVD method, then, a sidewall film SW made from the insulating film is formed on the side wall of the gate electrode G by an anisotropic etching.

Next, an n-type high-concentration impurity region SD is formed in the active areas (AcP1, AcP2, pW) of both sides of a combined body of the gate electrode G and the sidewall film SW. For example, the n-type high-concentration impurity region SD is formed by introducing an n-type impurity by employing an ion injection method. The n-type high-concentration impurity region SD has the impurity concentration higher than the n-type low-concentration impurity region EX, and it is formed so as to extend to a deeper position.

Next, a p-type high-concentration impurity region SD is formed in the active areas (AcN1, AcN2, nW) of both sides of a combined body of the gate electrode G and the sidewall film SW. For example, the p-type high-concentration impurity region SD is formed by introducing a p-type impurity by employing an ion injection method. The p-type high-concentration impurity region SD has the impurity concentration higher than the p-type low-concentration impurity region EX, and it is formed so as to extend to a deeper position. The so-called source-drain area of a LDD (Lightly Doped Drain) structure is formed by the high-concentration impurity region SD and the low-concentration impurity region EX.

According to the above process, the six transistors (Dr1, Acc1, Lo1, Lo2, Acc2, Dr2) which form an SRAM memory cell are approximately completed.

Next, a metal silicide layer 13 is formed over the gate electrode G and the source-drain area (SD) by the Salicide (Self Aligned Silicide) technology. For example, by forming a metal film, such as a nickel (Ni) film, over a transistor, and heat-treating it, a silicide formation reaction is caused in the contact area of the gate electrode G and the Ni film, and in the contact area of the source-drain area (SD) and the Ni film. After that, the nickel silicide film is formed by removing an unreacted Ni film.

Figure 22:
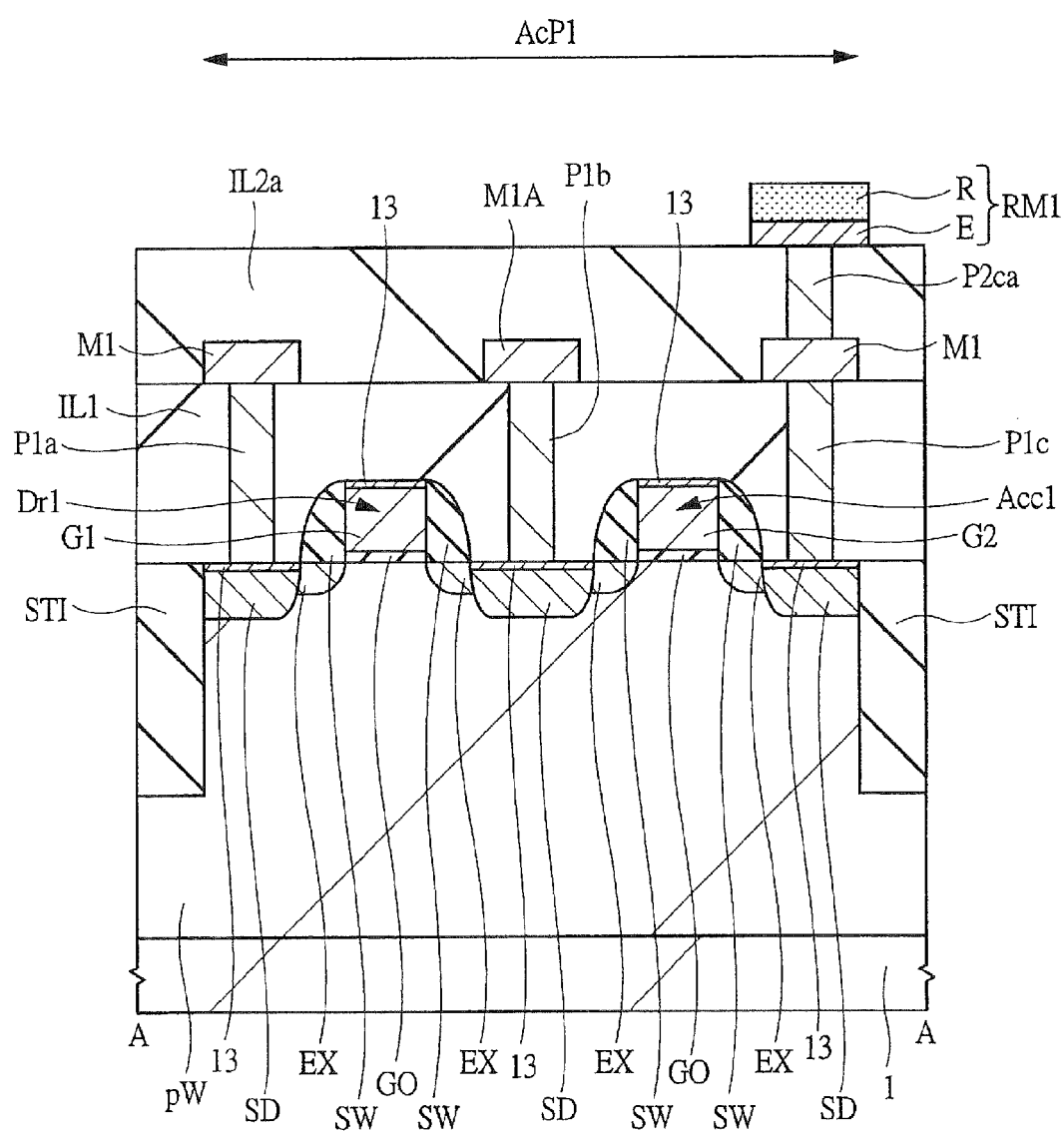
FIG. 22 is a sectional view illustrating manufacturing process of the semiconductor memory device according to the present embodiment, continuing the sectional view illustrated in FIG. 20.
Figure 23:
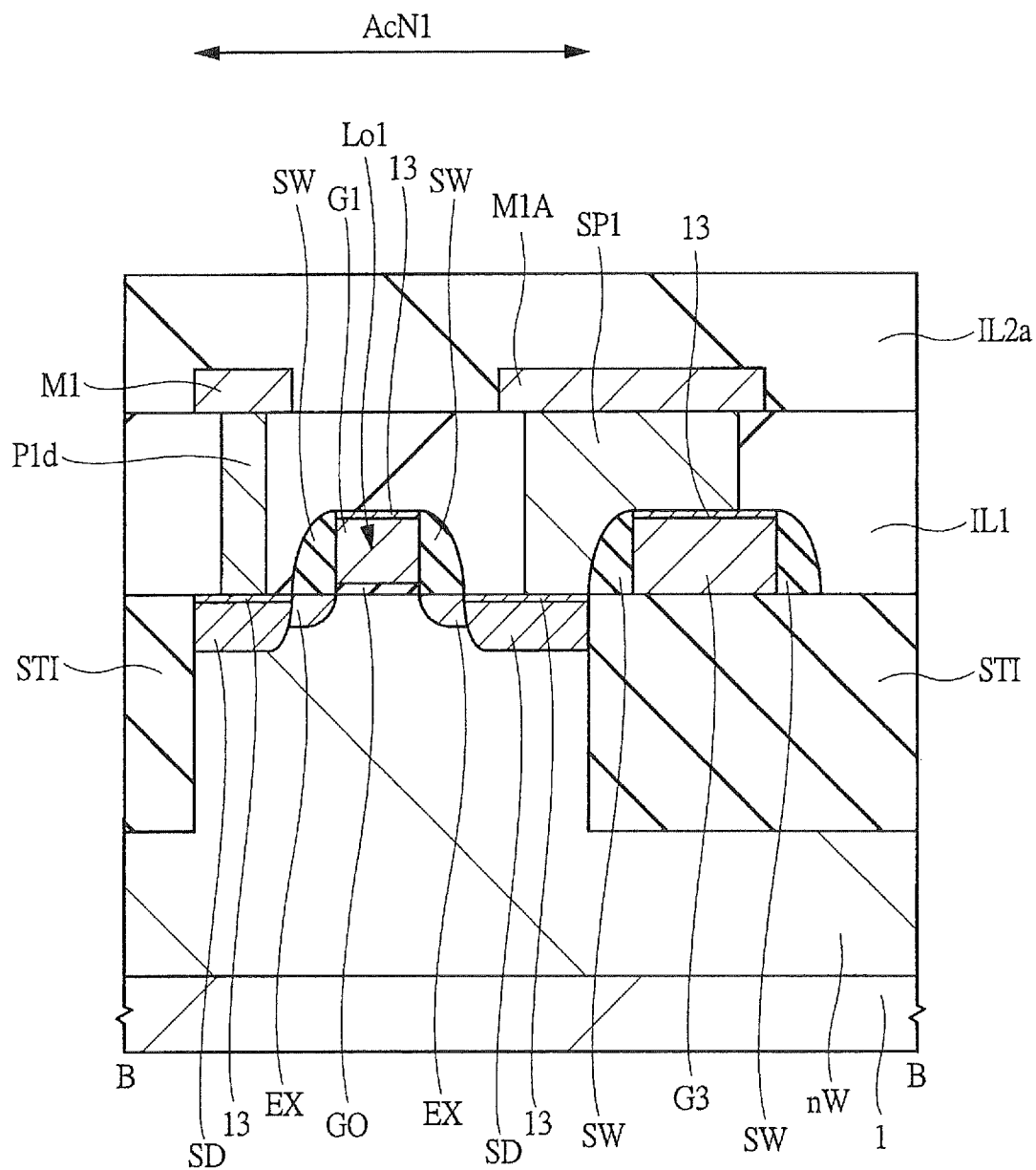
FIG. 23 is a sectional view illustrating manufacturing process of the semiconductor memory device according to the present embodiment, continuing the sectional view illustrated in FIG. 21.

Next, as illustrated in FIGS. 22 and 23, the first plugs P1 (P1a-P1j, SP1) are formed over the source-drain area (SD) and the gate electrode (G) of each of the transistors (Dr1, Acc1, Lo1, Lo2, Acc2, Dr2) (refer to FIG. 14, etc.).

First, a laminate film which is comprised of a silicon nitride film and a silicon oxide film is formed as an interlayer insulation film IL1 over each of the transistors (Dr1, Acc1, Lo1, etc.), for example. This silicon nitride film plays the role of an etching stopper in etching the silicon oxide film, and is formed as a thinner film than the silicon oxide film.

Next, a contact hole is formed by etching the interlayer insulation film IL1. In this case, in the part of the gate electrode G3, a contact hole which extends from the top of the gate electrode G3 to the top of the source-drain area (SD) of Lo1 is formed (the same applies to the part of G1). Next, a conductive film is deposited over the interlayer insulation film IL1 including the interior of the contact hole. As the conductive film, a laminate film which is comprised of a barrier film (not shown) and a metal film can be employed. As the barrier film, a Ti (titanium) film, a TiN (titanium nitride) film, or a laminate film of these films can be employed, for example. As the metal film, a W (tungsten) film, etc. can be employed, for example. The deposited conductive film except for the conductive film in the contact hole is removed by employing the CMP method, etc., to bury a conductive film in the contact hole; consequently, the first plugs P1 (P1a-P1j, SP1) are formed.

Next, a first layer wiring M1 is formed over the plug P1. The first layer wiring M1 can be formed by patterning a conductive film, such as an Al (aluminum) film (refer to FIG. 15, etc.).

Next, the ReRAM units (RM1, RM2) are formed over the first layer wiring M1. Specifically, the ReRAM unit RM1 is formed, via the second plug P2ca, over the first layer wiring M1 over the first plug P1c formed over the source-drain area of Acc1.

First, an interlayer insulation film IL2a is formed over the first layer wiring M1. As the interlayer insulation film IL2a, a laminate film comprised of a silicon nitride film and a silicon oxide film is formed, for example. Next, a contact hole is formed by etching the interlayer insulation film IL2a over the first layer wiring M1 coupled to the first plug P1c. In the contact hole, the second plug P2ca is formed by burying a conductive film, as is the case with the first plug P1.

Next, a conductive film is deposited over the interlayer insulation film IL2a including over the second plug P2ca, and furthermore the material of the resistance change layer R is deposited, then these laminated films are patterned; consequently, the electrode part E and the resistance change layer R are formed over the second plug P2ca. As the material of the electrode part E, a Pt (platinum) film, a W (tungsten) film, etc. can be employed, for example. As the material of the resistance change layer R, the material of which the resistance changes by the predetermined potential difference as described above can be employed. Although there is no restriction in the material, $Cu_xSi_yO$, GeO, GeSe, etc. can be employed, for example. In particular, the $Cu_xSi_yO$ (compound containing copper and silicon oxide) exhibits a resistance change at a potential difference of about 2-3V. The $Cu_xSi_yO$ film can be formed easily by a spattering process, etc., using a composite target containing Cu and $SiO_2$; accordingly, the $Cu_xSi_yO$ film is suitable to be employed as the resistance change layer R of the present embodiment. It is preferable to employ, for example, Ru (ruthenium) as the material of the electrode part E, and a laminate film comprised of WO (tungsten oxide) and TiO (titanium oxide) as the material of the resistance change layer R. In the present embodiment, the resistance change layer R employed for the ReRAM is explained as the example. However, as described above, if the material exhibits a resistance change by a predetermined potential difference, it is also possible to employ the material which is employed for the so-called PRAM (Phase change RAM, phase change memory) and the MRAM (Magnetoresistive RAM, magnetoresistive memory). In this way, it is possible to attain the occupied area reduction of the device by arranging the ReRAM units (RM1, RM2) over the second plugs P2ca and P2fa. It is also possible to attain a high level of integration of the memory cell.

Figure 24:
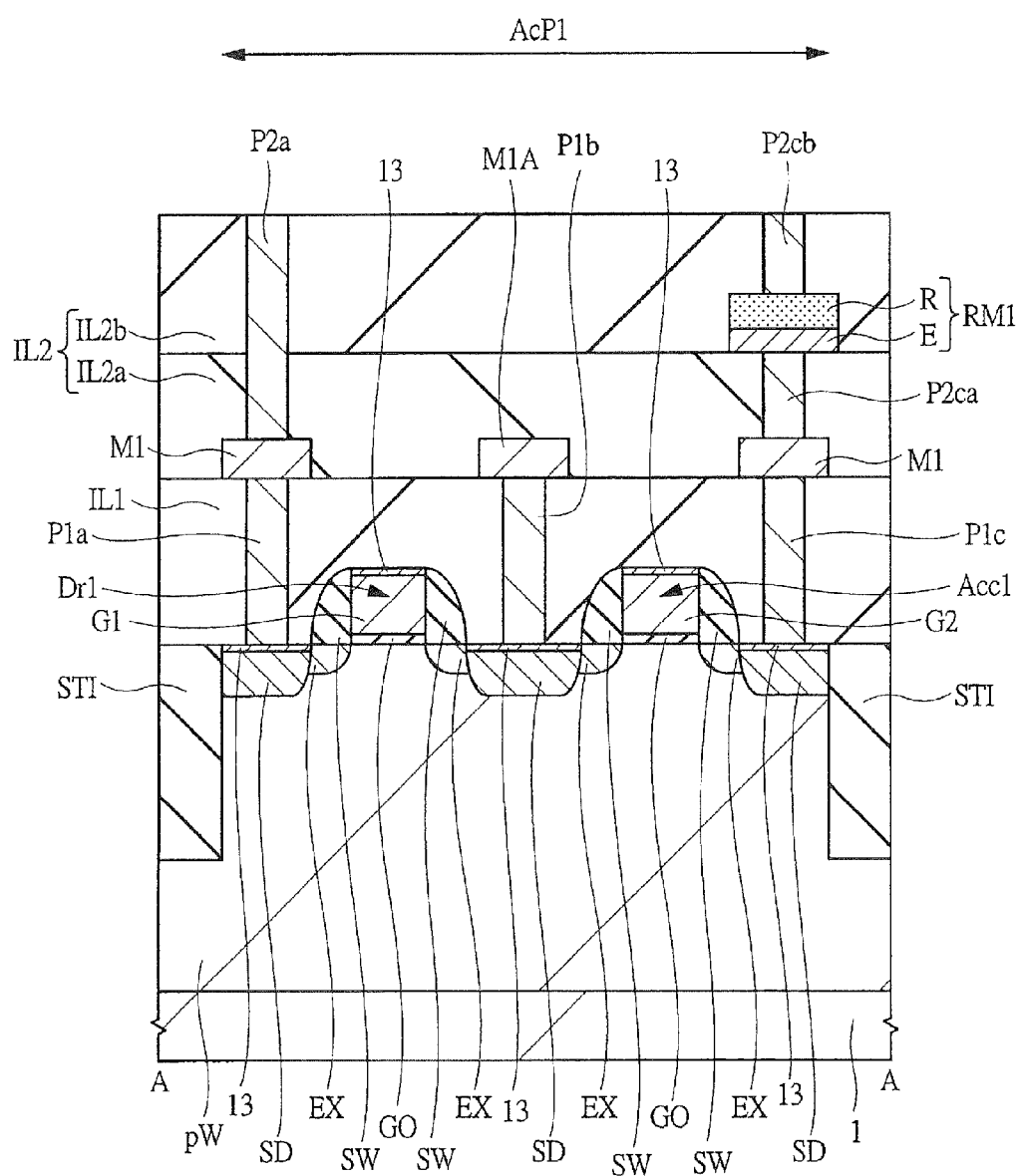
FIG. 24 is a sectional view illustrating manufacturing process of the semiconductor memory device according to the present embodiment, continuing the sectional view illustrated in FIG. 22.
Figure 25:
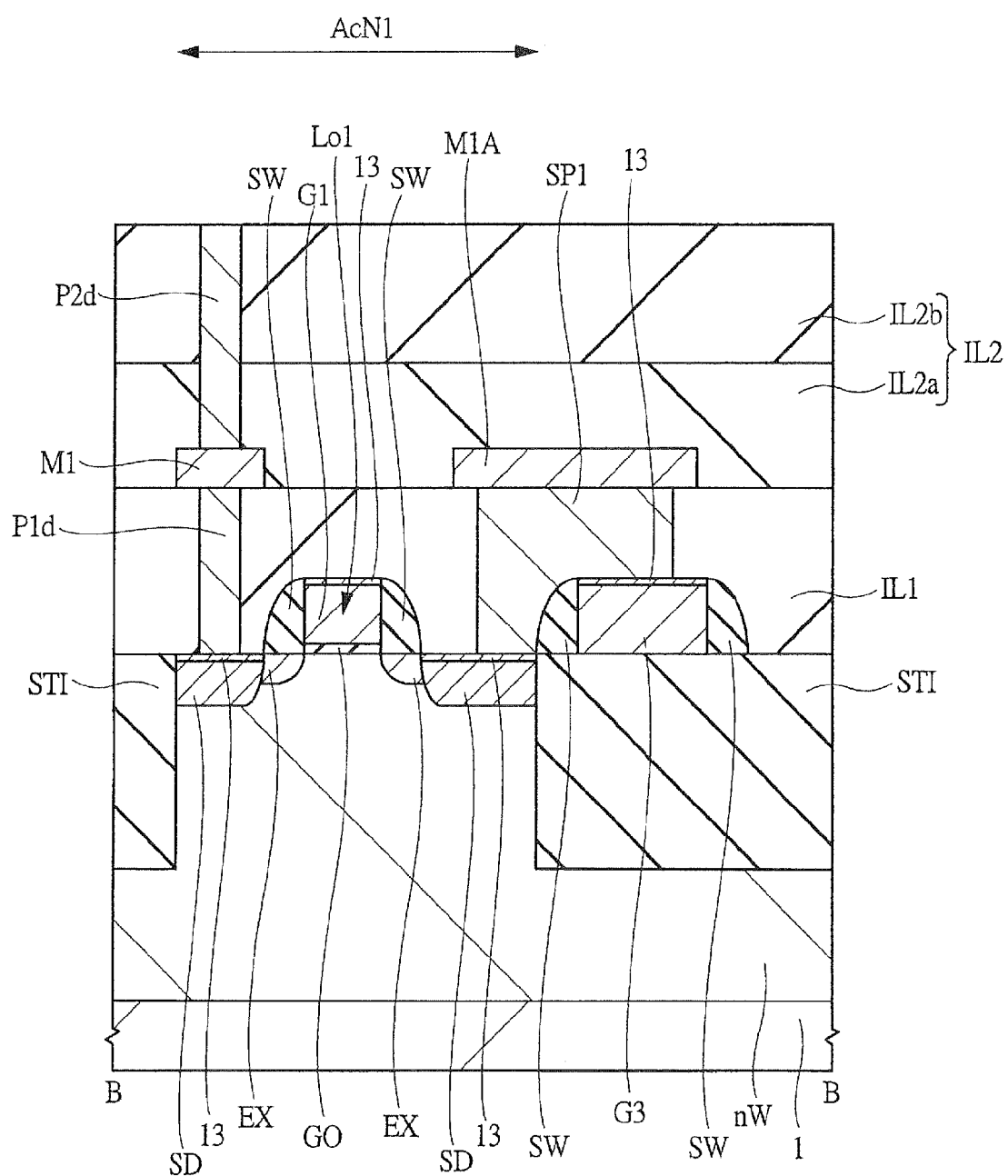
FIG. 25 is a sectional view illustrating manufacturing process of the semiconductor memory device according to the present embodiment, continuing the sectional view illustrated in FIG. 23.

Next, as illustrated in FIGS. 24 and 25, an interlayer insulation film IL2b is formed over the interlayer insulation film IL2a including over the resistance change layer R. As the interlayer insulation film IL2b, a laminate film comprised of a silicon nitride film and a silicon oxide film is formed, for example. Next, a contact hole is formed over the resistance change layer R by etching the interlayer insulation film IL2b. In the present contact hole, a second plug P2cb is formed by burying a conductive film, as is the case with the first plug P1. In the above-described etching of the interlayer insulation film IL2b, the interlayer insulation film IL2a under the interlayer insulation film IL2b is etched concurrently; thereby, the contact hole which penetrates these films is formed. By burying a conductive film also in the present contact hole, the second plugs P2 (P2a, P2d, etc.) are formed concurrently with the second plug P2cb.

Figure 26:
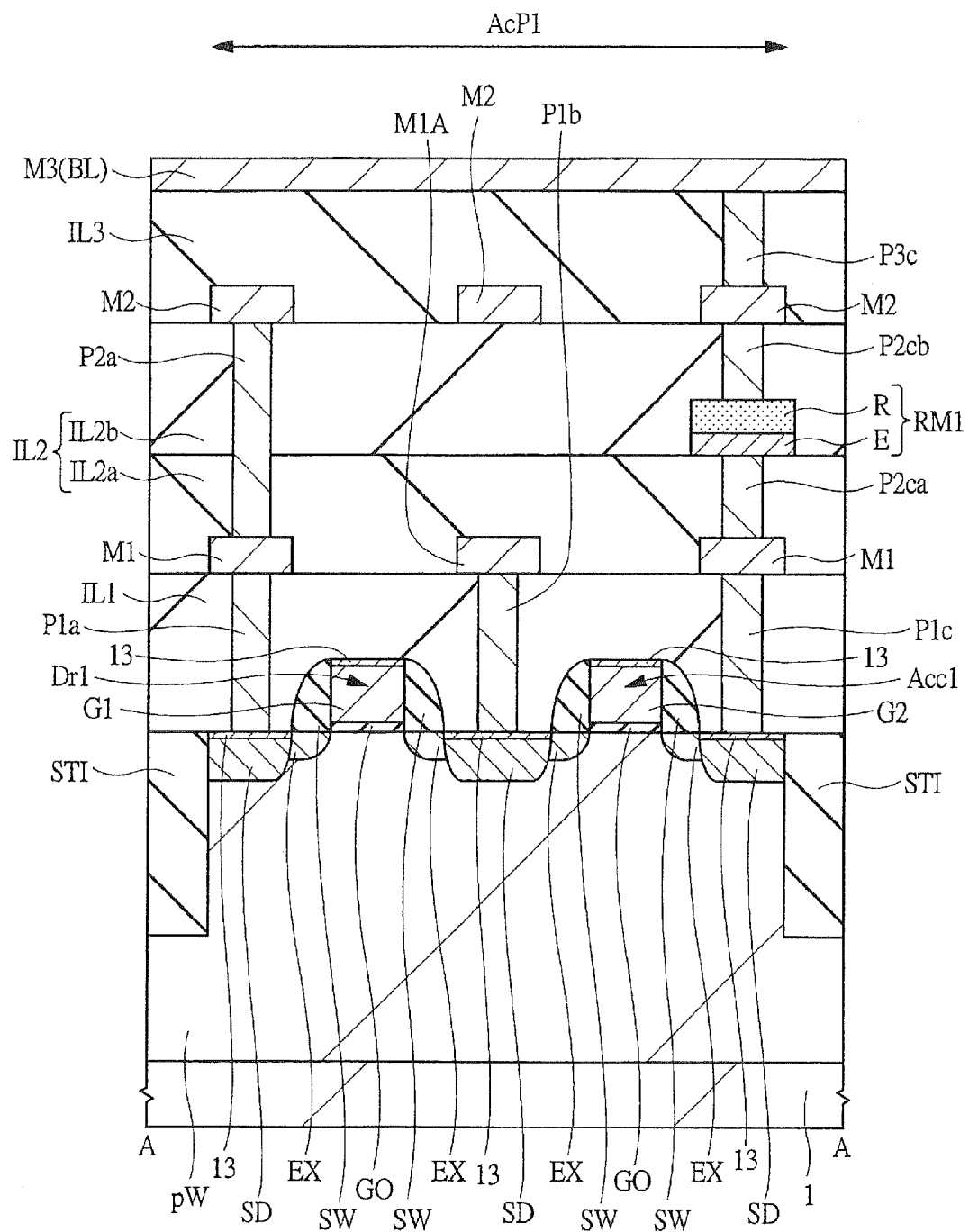
FIG. 26 is a sectional view illustrating manufacturing process of the semiconductor memory device according to the present embodiment, continuing the sectional view illustrated in FIG. 24.
Figure 27:
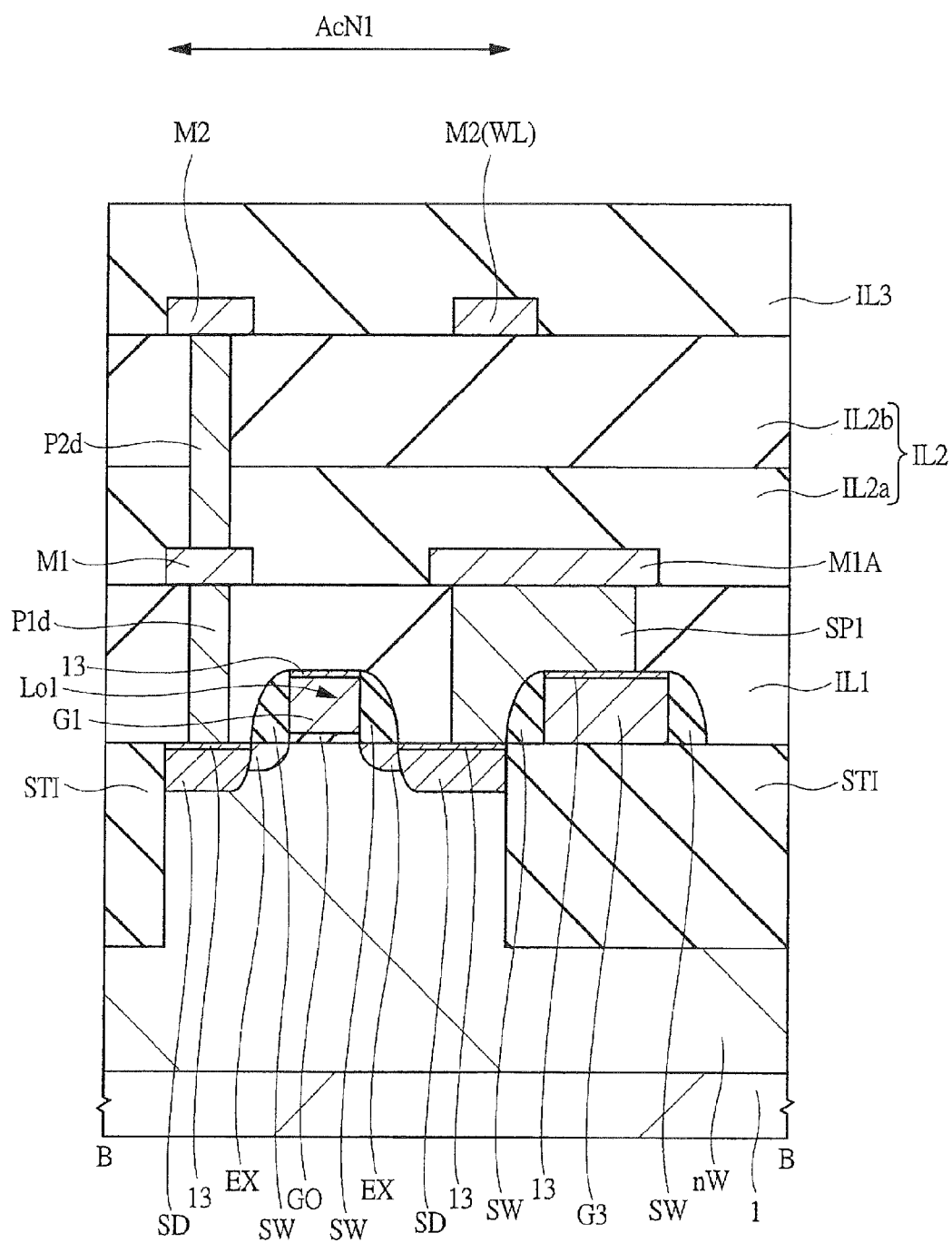
FIG. 27 is a sectional view illustrating manufacturing process of the semiconductor memory device according to the present embodiment, continuing the sectional view illustrated in FIG. 25.

Next, as illustrated in FIGS. 26 and 27, the second layer wiring M2 is formed over the second plug P2, and the third layer wiring M3 is formed over the second layer wiring M2 via the third plug P3 (refer to FIG. 16, FIG. 17, etc.). For example, the second layer wiring M2 is formed by depositing and patterning a conductive film such as an Al film over the interlayer insulation film IL2b including over the second plug P2. Furthermore, a laminate film comprised of a silicon nitride film and a silicon oxide film is formed as an interlayer insulation film IL3 over the second layer wiring M2. Next, by etching the interlayer insulation film IL3, a contact hole is formed and the third plug P3 is formed by burying a conductive film in the contact hole. Next, the third layer wiring M3 is formed by depositing and patterning a conductive film such as an Al film, over the interlayer insulation film IL3 including over the third plug P3. Next, it is preferable to form an interlayer insulation film IL4, etc. over the third layer wiring M3, and furthermore, to form a multilayer wiring.

It is also preferable to form the first layer wiring M1 through the third layer wiring M3 as an embedded wiring (damascene wiring). For example, the interlayer insulation film IL1 is formed as a laminated structure of the first insulating film for a wiring groove and the second insulating film for an inter-wiring area, and the damascene wiring is formed by burying a conductive film in the wiring groove formed in the first insulating film. In the wiring after the second layer wiring M2, a plug and wiring (conducting film) may be formed at the same time by burying a conductive film concurrently in the contact hole in the second insulating film, and the wiring groove in the first insulating film (a dual damascene method).

According to the above process, the semiconductor memory device according to the present embodiment illustrated in FIGS. 14-19 is approximately completed.

In the present embodiment, the ReRAM units RM1 and RM2 are formed between the second layer wiring M2 and the first layer wiring M1. However, the position of the ReRAM units RM1 and RM2 is not limited to such a position, but another position is also preferable as long as it is between the bit lines (EL, /BL) and the one end of the access transistors (Acc1, Acc2) (however, on the opposite side of the storage nodes A and B) (refer to FIG. 6, etc.). For example, the ReRAM units RM1 and RM2 may be arranged between the source-drain area (SD) of the access transistors (Acc1, Acc2) and the first layer wiring M1, or may be arranged between the third layer wiring M3 and the second layer wiring M2.

It is possible to omit the electrode part E and preferably to form the resistance change layer R directly over the second plug P2a.

It is needless to say that a concrete potential, such as 1.5V and 2.0V, explained in the embodiment, is only an example and can be changed variously in the range which does not deviate from the gist. In write of the retained data of the SRAM to the ReRAM unit, it is preferable to set any of the two ReRAM units (RM1, RM2) to ON state (ON), corresponding to the potential of the storage nodes A and B, and it is also preferable to set the ReRAM unit RM2 to ON state, contrary to the case of the embodiment where the ReRAM unit RM1 is set to ON state. It is needless to say that the write-back operation of the data corresponding to the storage nodes A and B is also suitably changed in such a case.

As described above, the invention accomplished by the present inventors has been concretely explained based on various embodiments. However, it cannot be overemphasized that the present invention is not restricted to the embodiments described above, and it can be changed variously in the range which does not deviate from the gist.

The present invention is widely applicable to a semiconductor memory device.

What is claimed is:

1. A semiconductor memory device comprising:
   (a1) a first transistor coupled between a power node and a first node;
   (a2) a second transistor coupled between the first node and a low potential node;
   (a3) a third transistor coupled between the power node and a second node;
   (a4) a fourth transistor coupled between the second node and the low potential node;
   (a5) a fifth transistor with one end coupled to the first node;
   (a6) a sixth transistor with one end coupled to the second node;
   (b1) a first resistance change layer coupled between another end of the fifth transistor and a first bit line; and
   (b2) a second resistance change layer coupled between another end of the sixth transistor and a second bit line,
   wherein, in a first period when a first power supply is applied to the power node, the first resistance change layer and the second resistance change layer are in a low resistance state, and
   wherein the other end of the sixth transistor is supplied with a second potential which is applied to the power node and is greater than the potential of the first power supply, via the first transistor.

2. The semiconductor memory device according to claim 1, wherein the first resistance change layer and the second resistance change layer change a resistance when a potential difference of potentials applied to both ends of the first and second resistance change layers is greater than a predetermined potential.

3. The semiconductor memory device according to claim 2, wherein the first resistance change layer decreases in resistance and becomes in the low resistance state, when a potential of the first bit line is greater than a potential of the other end of the fifth transistor, with the potential difference greater than the predetermined potential, and wherein the second resistance change layer decreases in resistance and becomes in the low resistance state, when a potential of the second bit line is greater than a potential of the other end of the sixth transistor, with the potential difference greater than the predetermined potential.

4. The semiconductor memory device according to claim 3, wherein the first resistance change layer increases in resistance and becomes in a high resistance state, when the potential of the first bit line is less than the potential of the other end of the fifth transistor, with the potential difference greater than the predetermined potential, and wherein the second resistance change layer increases in resistance and becomes in a high resistance state, when the potential of the second bit line is less than the potential of the other end of the sixth transistor, with the potential difference greater than the predetermined potential.

5. The semiconductor memory device according to claim 4, wherein the potentials of the first node and the second node are able to be read to the first bit line and the second bit line, respectively, and wherein a potential of the first node and the second node are able to be rewritten, via the first bit line and the second bit line, respectively.

6. The semiconductor memory device according to claim 1, wherein, in response to an end of the first period, one of the first resistance change layer and the second resistance change layer is set to the high resistance state.

7. The semiconductor memory device according to claim 6, wherein the predetermined potential is greater than the potential of the first power supply.

8. The semiconductor memory device according to claim 7, wherein, in response to the end of the first period, when the potential of the first node is a first level and the potential of the second node is a second level greater than the first level, the second resistance change layer is set to the high resistance state.

9. The semiconductor memory device according to claim 8, wherein the second resistance change layer is set to the high resistance state, by making the potential of the other end of the sixth transistor greater than the potential of the second bit line, with the potential difference greater than the predetermined potential.

10. The semiconductor memory device according to claim 1, wherein, in a second period when a potential less r than the first power supply is applied to the power node, data indicative of a potential state of the first node and the second node at a time of an end of the first period is stored by a write operation which sets one of the first resistance change layer and the second resistance change layer to the high resistance state.

11. The semiconductor memory device according to claim 10, wherein, in a third period after the second period, a determination of the data is made by detecting one of the low resistance state and the high resistance state of the first resistance change layer and the second resistance change layer.

12. The semiconductor memory device according to claim 11, wherein, on a basis of the determination, a third power supply greater than the first power supply by the predetermined potential is applied to a bit line coupled to a node determined to be at a high potential between the first node and the second node, and one of the first resistance change layer and the second resistance change layer, which is located on a side of the node, is set to a low resistance state and the node is set to a high potential.

13. A semiconductor memory device comprising:
(a1) a first transistor coupled between a power node and a first node comprising a first wiring layer;
(a2) a second transistor coupled between the first node and a low potential node;
(a3) a third transistor coupled between the power node and a second node;
(a4) a fourth transistor coupled between the second node and the low potential node;
(a5) a fifth transistor with one end coupled to the first node;
(a6) a sixth transistor with one end coupled to the second node;
(b1) a first resistance change layer coupled between another end of the fifth transistor and a first bit line; and
(b2) a second resistance change layer coupled between another end of the sixth transistor and a second bit line,
wherein the first resistance change layer is arranged over a first connection section comprising the first wiring layer which is formed over a source-drain area of the fifth transistor, and
wherein the first bit line is arranged above the first resistance change layer.

14. The semiconductor memory device according to claim 13,
wherein the second resistance change layer is arranged over a second connection section over a source-drain area of the sixth transistor, and
wherein the second bit line is arranged over the second resistance change layer.

15. The semiconductor memory device according to claim 14, wherein the first resistance change layer and the second resistance change layer change a resistance when a potential difference of potentials applied to both ends of the first and second resistance change layers is greater than a predetermined potential.

16. The semiconductor memory device according to claim 15, wherein the first resistance change layer decreases in resistance and becomes in a low resistance state, when a potential of the first bit line is greater than a potential of the other end of the fifth transistor, with the potential difference greater than the predetermined potential, and the first resistance change layer increases in resistance and becomes in a high resistance state, when the potential of the first bit line is less than the potential of the other end of the fifth transistor, with the potential difference greater than the predetermined potential.

17. The semiconductor memory device according to claim 16, wherein the second resistance change layer decreases in resistance and becomes in a low resistance state, when a potential of the second bit line is less than a potential of the other end of the sixth transistor, with the potential difference greater than the predetermined potential, and the second resistance change layer increases in resistance and becomes in a high resistance state, when the potential of the second bit line is less than the potential of the other end of the sixth transistor, with the potential difference greater than the predetermined potential.

18. The semiconductor memory device according to claim 13, wherein at least one of the first resistance change layer and the second resistance change layer include $Cu_xSi_yO$.

19. The semiconductor device according to claim 13,
wherein, in a first period when a first power supply is applied to the power node, the first resistance change layer and the second resistance change layer are in a low resistance state, and
wherein the other end of the sixth transistor is supplied with a second potential which is applied to the power node and is greater than the potential of the first power supply, via the first transistor.

* * * * *